(12) United States Patent
Slafer et al.

(10) Patent No.: US 11,467,397 B2
(45) Date of Patent: Oct. 11, 2022

(54) METHODS AND APPARATUS FOR FORMING DUAL POLARIZED IMAGES

(71) Applicant: MICROCONTINUUM, INC., Watertown, MA (US)

(72) Inventors: W. Dennis Slafer, Arlington, MA (US); Christine Higgins, Acton, MA (US)

(73) Assignee: MicroContinuum, Inc., Watertown, MA (US)

(*) Notice: Subject to any disclaimer, the term of this patent is extended or adjusted under 35 U.S.C. 154(b) by 912 days.

(21) Appl. No.: 15/962,702

(22) Filed: Apr. 25, 2018

(65) Prior Publication Data

US 2018/0314061 A1 Nov. 1, 2018

Related U.S. Application Data

(60) Provisional application No. 62/489,585, filed on Apr. 25, 2017.

(51) Int. Cl.
  *G02B 5/30* (2006.01)
  *G02B 27/00* (2006.01)
  *G03F 7/42* (2006.01)

(52) U.S. Cl.
  CPC ....... *G02B 27/0018* (2013.01); *G02B 5/3041* (2013.01); *G03F 7/42* (2013.01); *G02B 5/3058* (2013.01)

(58) Field of Classification Search
  CPC .................. G02B 5/3041; G02B 27/0018
  USPC .................................... 359/487.02
  See application file for complete search history.

(56) References Cited

U.S. PATENT DOCUMENTS

| | | | | |
|---|---|---|---|---|
| 2,281,101 A | * | 4/1942 | Land ................. | G03C 9/04 359/465 |
| 2,315,373 A | * | 3/1943 | Land ................. | G03C 9/04 359/465 |
| 2,329,543 A | * | 9/1943 | Land ................. | G03C 9/04 359/486.02 |
| 2,348,912 A | * | 5/1944 | Land ................. | G03C 9/04 359/486.02 |
| 2,811,893 A | * | 11/1957 | Ryan ................ | G03C 9/04 359/465 |
| 5,327,285 A | * | 7/1994 | Faris ................. | G02B 27/28 359/486.02 |

(Continued)

*Primary Examiner* — Ricky D Shafer
(74) *Attorney, Agent, or Firm* — Daly, Crowley, Mofford & Durkee, LLP

(57) ABSTRACT

Methods are described for forming polarized image films in which a displayed image changes depending on the state of polarization of a backside illumination source. Methods are also described for eliminating the leakage of unpolarized light through certain parts of the images resulting in unwanted visual artifacts in these images. Polarized dual graphic films achieving images with higher optical density and uniformity, minimum ghosting and mis-registration, can be made by a manufacturing technique that is faster, capable of higher production volumes, and that can produce polarized images at a lower cost. An exemplary method provides for forming a polarized image or pattern on an oriented substrate by using a negative patterned resist image or pattern formed by graphic arts techniques, followed by the imbibition of a dichroic dye or iodine ink to form a corresponding positive image in the areas not protected by the resist.

18 Claims, 16 Drawing Sheets

(56) References Cited

U.S. PATENT DOCUMENTS

| | | | | |
|---|---|---|---|---|
| 5,459,000 | A | * | 10/1995 | Unno .................. G03F 7/70091 |
| | | | | 359/486.02 |
| 5,758,036 | A | * | 5/1998 | Scarpetti ................ B41J 2/2107 |
| | | | | 347/2 |
| 2002/0172893 | A1 | * | 11/2002 | Kozenkov ............ G02B 5/3033 |
| | | | | 430/321 |
| 2005/0105180 | A1 | * | 5/2005 | Mackey .................... G03F 1/50 |
| | | | | 359/487.02 |
| 2005/0146662 | A1 | * | 7/2005 | Inoue ................ G02F 1/134363 |
| | | | | 349/129 |
| 2006/0187383 | A1 | * | 8/2006 | Broer ........................ G03F 7/30 |
| | | | | 349/113 |
| 2013/0127897 | A1 | | 5/2013 | Baker et al. |
| 2014/0234780 | A1 | * | 8/2014 | Kobrin ...................... G03F 7/40 |
| | | | | 430/323 |

\* cited by examiner

METHODS AND APPARATUS FOR FORMING DUAL POLARIZED IMAGES

CROSS-REFERENCE TO RELATED APPLICATION

This application is based upon and claims priority to U.S. provisional patent application 62/489,585, entitled "Methods and Apparatus for Forming Dual Polarized Images," filed Apr. 25, 2017; the entire content of this noted provisional application is incorporated herein by reference.

BACKGROUND

Several types of polarizers exist today, including naturally occurring birefringent crystals, wire grid polarizers, silver nanoparticle polarizers, etc., but the most common polarizer by far is the iodine/oriented polymer (PVA) type, developed by Polaroid in the 1940's. On the atomic scale, most synthetic polarizers essentially consist of nanoscale parallel lines of absorbing or reflecting materials, and in the case of the Polaroid-type polarizer, the absorbing material is iodine. It has been long known that the molecules comprising certain polymeric materials, such as polyvinyl alcohol ('PVA'), can be made to align in a particular direction, typically by stretching. Imbibing a solution of molecules into this oriented polymer that have the property of aligning themselves with the oriented polymer chain is a very well-known method for producing polarizing films. The use of polarized images to produce static displays goes back nearly as far, with the development of 'vectograph' process by Polaroid Corp (Land). The left and right components of a stereographic (3D) image pair were converted into a corresponding pair of monochrome images with orthogonal polarization (i.e., printing each of the images on a stretched ['oriented'] PVA substrate in orthogonal directions) using a complex dye transfer process, followed by the lamination of the two images together in registration, thereby producing a single-sheet 3D image for viewing through polarized 3D glasses having lenses with the corresponding orthogonal orientation. These images were typically formed using an iodine ink, or dichroic dye, similar to those used to make polarizing films using a complex dye transfer process to produce high-resolution continuous tone black and color images.

This complex process was greatly simplified with the advent of ink jet printing, and Polaroid Corp. developed a process to produce 3D images by printing dichroic ink jet dyes onto oriented PVA substrates, later improved at the Rowland Institute of Science (Scarpetti) and StereoJet, Inc. (Walworth, Slafer and Higgins). More recently, another application of polarized imaging has been proposed (Visteon) in which a pair of polarized graphic images with orthogonal polarization could be illuminated using a polarized light source, such that rotating the angle of polarization of the light source would display either one or the other image independently. One application for such a dual graphic film would be in automotive instrumentation displays, for example, where the state of a control can be displayed ("ON/OFF", "HOT/COLD", etc.) by electronically switching between two polarized LED backlights, without requiring the viewer to be wearing polarized glasses. The ability to display dual images in the same physical location, given the limited space available in automobile dashboards, combined with the elimination of moving parts for such a device, makes this a very attractive, low-cost means of displaying information for autos, vehicles in general, as well as for other information display applications.

However, there are several drawbacks to the prior art methods for producing these dual graphics by the ink jet process: the iodine ink used to form polarizers is very corrosive and is not compatible with commercially available ink jet heads, while dichroic inks applied by an ink jet or other print process, require a long time (many hours) to imbibe into the PVA. The use of dichroic inks to form the image requires the use of a temporary polymeric "holding" layer to localize the ink droplets and prevent the ink from "running" or migrating away from its target location, which would result in a degradation of image resolution and quality. But the holding layer presents significant problems, most critically that it retains a significant amount of the applied dye, limiting the amount that is ultimately available to reach the PVA and thereby limiting the density of the polarized image. With little or no holding layer, the ink will drip and run, producing an unacceptable image, and with thicker holding layers, much of the dye never gets to the PVA, producing low image density.

Another factor that reduces image density as well as image uniformity in common prior art methods of polarized image formation is the PVA itself. The well-known commercial process for producing oriented PVA, that is used to make polarizing films, utilizes a stretching operation in which a typically cast PVA film is elongated in one direction by several times its original dimension (typically 4× to 8×). This film is then immersed in an iodine bath, in a process called 'staining', in order to provide optical density for the polarizer by the iodine molecules aligning with the linearly oriented PVA molecules. Not only does the PVA contain additional chemical additives to facilitate stretching and handling, but the bath can also contains other additives, such as boric acid, which are used to stabilize the iodine-stained polarizer. The molecular weight and other PVA properties are chosen to optimize stability and performance for polarizing films such as those used in displays for TVs, computers and mobile devices, and for polarizing sunglasses and 3D viewing.

To provide a cost effective process, the printing of polarizing images requires the commercial availability of the key component, unstained (un-dyed) oriented PVA substrate. Polarizing film manufacturers have generally adopted the types of PVA and/or the processing methods described above, further exacerbating the already problematic ink jet imaging process for producing polarized images. For example, the use of boric acid in the processing baths to stabilize or harden (crosslink) the PVA severely inhibits the uptake of dichroic dyes and iodine ink. Also, the PVA additives and processing cause non-uniform absorption of ink by the PVA, resulting in non-uniform image density (dark and light density variations in an area of nominally constant image density).

Prior art techniques of making dual polarized image films, especially for 3D imaging, typically use a single film with two layers of oriented PVA, one on each side of a transparent, non-polarizing support core (typically PVA (Scarpetti). In this case, the PVA is stretched at +45 degrees to the direction of the support film one side, and −45 degrees on the other. The result is two orthogonally oriented PVA layers in a single film (Polaroid). Although this may appear convenient in requiring only a single film to support two orthogonal polarized images, it has certain drawbacks, including: two images separated by the thickness of the core result in parallax errors, image layers facing outward are unprotected from physical damage (unless two additional layers of a non-polarizing transparent film are laminated over each image), and second image layers must be carefully registered to first image layers, since mis-registration errors (such as by printer slippage, etc.) results in the ruin of both films, increasing waste and cost.

FIGS. 1A-1B depict examples of prior art techniques of making dual polarized image films. FIG. 1A illustrates an example of a prior art technique in which two image panels (102/104 and 107/108) are illuminated through a linear polarizing film (101) having a particular orientation, in this case one in which the PVA is stretched along the direction of travel of the film so as to align the PVA molecules to that direction, hereafter called the 'machine' direction and indicated by the orientation of the double arrow. Panel 102/104 comprises three polarized images, 103 on the right side and 105 & 106 on the left side, wherein the left pair of images (102/104) has been formed on a PVA substrate whose orientation direction is perpendicular to the machine (stretch) direction of the film, hereafter called the 'cross' direction. The polarized images on the right side (107/108) are formed on PVA whose stretch direction is the same as polarizer 101, i.e., the machine direction.

Because the axis of orientation of the PVA, also called the polarization direction, between polarizer 101 and image 102/104 is orthogonal, light passing through 101 is polarized in a direction perpendicular to that of film 102/104, and therefore maximum extinction occurs in light passing through 102/104. Because the polarization axes of polarizer 102 and film 107/108 are parallel, maximum light is transmitted through this 107/108. The term Dmin will be used hereafter to denote the condition in which minimum optical density of the film is produced, and Dmax when the maximum density (i.e., darkest color) is produced.

Referring to FIG. 1B, film 102/104 is superimposed over film 107/108, resulting in only the image of the topmost layer being visible to the viewer (111), since the polarization axis of this layer and the polarization axis of light transmitted through polarizer 101 from light source (110) are orthogonal. It may be noted that clear triangle graphic 106 in panel 104, being overlaid onto a continuous part of film 107 having density Dmin, exhibits this density to viewer 111. Clear aperture 105 in panel 104 is overlaid with clear aperture 115 of panel 108, thus essentially all the light from 101 is seen by viewer 111, and this light is therefore brighter than the light transmitted by 106.

FIGS. 2A-2B depict examples of further prior art techniques. In FIG. 2A, panels 122/124 and 127/128 have the same graphic images as the corresponding panels in FIG. 1A, but in this case the axis of orientation of polarizer 121 is perpendicular, thus panels 122/124 exhibit Dmin and panels 127/127 exhibit Dmax. FIG. 2B shows the result of again superimposing the left panel 122/124 over the right panel 127/128 (not shown for clarity). In this case the right side graphics 105 and 109 are seen by the viewer, but graphic 207 is not seen because the back panel 127/128 (not shown for clarity), whose polarization axis is perpendicular to that of the polarized light source, is dark and essentially no light gets to triangle 106. It may also be noted that while full brightness is seen through circle 105, the elements of large circle 109 that overlap with large triangle 103 (i.e., 114) have a lower light transmittance than the center 110 of the circle.

Thus for both cases illustrated in FIGS. 1B and 2B, there can be an objectionable level of one image 'bleeding through' the other, giving rise to "ghost" images when viewing the displayed information.

Another issue is the inability to adequately register two matching images due to non-uniform dimensional distortion of the PVA substrate due to thermal and mechanical changes to the substrate.

SUMMARY

The present disclosure details methods, apparatus, and products that remedy the noted shortcomings of the prior art by providing methods for producing polarized image films that can achieve high optical image densities with high image quality, reduced ghosting and mis-registration, provide physical image protection and that can be made by an efficient manufacturing process.

An aspect of the present disclosure provides methods for forming polarized image films in which a displayed image changes depending on the state of polarization of a backside illumination source. The present disclosure also includes, among others, methods for eliminating the leakage of unpolarized light through certain parts of the images resulting in unwanted visual artifacts in these images, which for the purposes of this disclosure will be referred to as 'ghosting'. The present disclosure also provide a method for producing polarized dual graphic films that is capable of achieving images with higher optical density and uniformity, minimum ghosting and mis-registration, and by a manufacturing means that is faster, capable of higher production volumes, and that can produce polarized images at a lower cost.

In a general embodiment of the present disclosure, an improved method provides for forming a polarized image or pattern on an oriented substrate, such as stretched PVA [polyvinyl alcohol polymer], by using a negative patterned resist image or pattern formed by graphic arts techniques, in particular ink jet printing or by contact or projection photomask imaging, followed by the imbibition of a dichroic dye or iodine ink to form a corresponding positive image in the areas not protected by the resist. Two such images, formed with their polarization axes being orthogonal, can be combined to form a dual image display as described above.

Another embodiment of the present disclosure provides a method in which a polymeric resist pattern is formed on a stretched PVA substrate (in turn, optionally, on a non-polarizing support film) by either ink jet or photomask methods. The resist is selected so as to be insoluble in the ink solution; for example, a solvent or UV-cured resist is used for an aqueous ink solution, whereas a water-based resist can be used with a solvent ink, etc. Rather than applying the ink directly to the PVA to form the positive image, as is done in the conventional art, the printing process is instead used to form a negative resist image, with the non-printed areas subsequently being exposed to the ink. Because the resist is 'cured' or otherwise solidified before the ink is applied, the requirement for a holding layer to stabilize the mobile ink during the long imbibition time is eliminated. In addition, heating of the ink solution can be used to increase the rate of ink uptake. It should be noted that this process can be used with iodine or dichroic inks Ink Jet Resist Formation: In one embodiment, the resist pattern is formed by UV ink jet printing, in which the negative of the desired image is formed by jetting a UV-curable polymer ink onto an oriented PVA substrate. The printed PVA layer is immersed in a bath containing a dichroic dye or an iodine staining solution, as are known to the art, for ample time to allow sufficient imbibition of the ink into the PVA to produce the required optical density and uniformity of the positive image. In this embodiment, the ink can also be applied by slot-die coating, rod coating or any type of flood coating. Further, the ink solution can be heated to increase the rate of ink uptake by the PVA. The inked film is then rinsed to remove any excess ink (or 'drag out' from the bath), followed by (optional) treatment of known art to stabilize the ink from further diffusion or bleaching (vectograph process).

Photomask Resist Formation: In another embodiment, a liquid polymeric resist is applied to the surface of an oriented PVA film then placed into contact with a photomask. The photomask, comprised of the rigid or flexible substrate, contains image areas that are transparent to or opaque to the radiation used to crosslink (cure) the liquid resist. The exposure radiation is typically in the UV or visible range, where the latter is often the case for LED light sources. The polymeric resist layer is exposed by the light source through the photomask, where, for negative photoresists, this action causes the resist to harden in the exposed areas, and in the case of positive resists, to become developable in the corresponding resist developer. After exposure, the mask is separated from the coated film and the film is rinsed, using either a material that is a solvent for the unexposed resist, as in the former case, or an appropriate developer for the resist in the latter case. Note that, depending on the tone of the photoresist, the photomask will be either clearfield or darkfield, referring to the photomask plate being either opaque or transparent, respectively, for the image elements.

Removal of the resist in the undesired areas reveals the surface of the PVA, which is subsequently exposed to the polarizing ink. The density can be controlled by the exposure of the masked PVA to the ink, and other methods can also be used, such as heat, to decrease the time required to reach the desired density. The dye uptake process is quenched at the appropriate time by removal of the excess ink by rinsing, followed by immersion in a stabilizing bath, such as is known to the art (vectograph, polarizers).

It is an aspect of the present disclosure that the photomask can be protected from contact with the resist by laminating the resist between the PVA substrate and a thin overlay film, such as optically clear polyester (Mylar©) or other such film, and placing the photomask in contact with the outer surface of the laminated film. To improve image formation by reducing reflections for the mask-overlay film interface, an index matching fluid or solvent can be used to temporary laminate the photomask to the overlay film during exposure of the resist. Separation of the photomask, followed by removal of the overlay film leaves the crosslinked resist, and any of the uncured resist that did not adhere to the overlay film, on the PVA surface. This uncured 'residue' material is then removed by rinsing with a solvent for the uncured resist. The patterned film is now ready for ink application. In this embodiment, the resist pattern is unaffected by the residue removal chemical or by the bath chemicals.

It is very common in the curing of UV adhesives that the exposing light source is not collimated, where image resolution will degrade as the separation distance between the photomask and the resist-coated PVA increases, thus using a thin overlay sheet, preferably less than 1 mil in thickness, is preferred in this disclosure. In addition, it is another aspect of this embodiment of the present disclosure that the overlay film has low adhesion to the cured resist polymer in order to prevent the cured material from being delaminated from the PVA surface during overlay removal. It is a further aspect of this disclosure that the PVA surface be treated in order to provide adequate adhesion to the cured resist, in order to prevent delamination during overlay separation. This can be done by chemical treatment (aqueous or solvent) of the PVA or by corona or other surface modification treatments that are known to the art to improve adhesion of applied polymers. Such methods of increasing the adhesion of the mask to the PVA layer can be used with the ink jet resist application as well.

In yet another embodiment, a resist mask is formed on an oriented film that has been previously inked (i.e., an oriented film to which iodine, dichroic or other polarizing ink has been applied to form a polarizing film), where the resist pattern so formed represents a positive version of the desired image. The resist-covered polarizer film is then immersed in a bath containing a bleaching agent that reacts with the ink (iodine, dichroic or other ink) used to form the polarizer film, in order to oxidize or otherwise eliminate the light absorbing properties of the ink. In this embodiment the resist mask if formed from a polymer that is unaffected by the bleaching process. In this example, the polymer covers the inked area that will remain polarized, leaving the unmasked areas exposed to the bleaching process. The final steps include neutralizing the bleaching process and stabilizing the polarized image, as necessary. It is also an aspect of this disclosure that the resist mask for the bleaching process can be formed by either ink jet printing or light exposure through a photomask.

Anti-Ghosting: One of the drawbacks of the dual polarized graphic display is light leakage through certain portions of the displayed image, resulting in an undesirable image bleed-through (ghosting) effect that degrades the quality of the image being displayed. This visual effect occurs where the clear areas of the pair of images overlap and results from the contrast between the areas in which both images are clear and the adjacent areas in which only one of the images is clear. For designs in which there is no overlap of the clear elements of either image, this ghosting effect does not occur. However, avoiding such overlap results in serious limitations of the display and must be eliminated in order to provide a usable dual polarized image display.

In order to understand the source of this effect, it is helpful to consider the characteristics of polarized imaging. For a single polarized image layer, inking process produces either clear or inked areas (where gray levels are formed by varying the ink dot or dot size density). In a dual polarized image, where two images are printed onto two oriented substrates at different substrate orientations, the superposition of both images, typically by lamination, produces three distinct image configurations: areas in which the inked portions of both images overlap, areas in which an inked portion of one image overlaps with a clear area of the other, and areas in which only the clear portions of both images overlap. When viewed with a linear polarizer aligned with the polarization axis of one of the two images (either using backside polarized illumination or backside unpolarized illumination with a front side polarizer), the first described areas will be darkest (highest optical density, or Dmax), as minimum light transmission occurs due to there being, effectively, two crossed polarizers. And regardless of the orientation of the back or front polarizer (i.e., either 0 or 90 degrees), the polarizer will always be orthogonal to one of the two films, always producing the Dmax condition. For the second configuration, the overlap of a clear and inked area, the minimum polarization density (Dmin) will occur when the back/front polarization state is parallel to the polarization of the inked image. This Dmin area represents the light transmission when two polarizers or oriented parallel, but is not 'zero', since all iodine or dichroic dye polarizers contain residual ink that is not aligned with the PVA molecules and hence contribute to the optical density but are non-polarizing. As more ink uptake is required to produce higher extinction levels (Dmax), more residual (non-polarizing) ink is retained in the polarizing film, raising the Dmin. In the third area, clear areas from the first film overlap with clear areas of the second film, thus there is no polarized absorption, and this component of the image is clear and invariant to the orientation of the back/from polarizer. It is the contrast between the second area and the totally clear area that result in the ghosting effect, giving the appearance of one image bleeding through the other. The contrast between these two areas is at a minimum when the polarized image has a very low Dmin (minimum ink uptake by the oriented PVA layer), resulting in negligible ghosting, but the Dmax of such a layer under these conditions is also low, allowing significant backlight leakage in the background (Dmax) areas.

One solution to the ghosting issue has been suggested, whereby "the clear areas could be provided with a compensating neutral density if so desired in order to exactly balance all the light from the first polarization area" (Visteon, US20130127897). However, this is not a practical method, since the filter must be non-polarizing and of a density to match the color and Dmin of each film, and more significantly, it must be applied exactly in those areas in which both layers are non-polarizing. This therefore requires an additional lamination, and with very precise registration. Aside from the cost and complexity of this added step, because there is inevitable dimensional distortion of all plastic films, particularly for stretched PVA, which is a very non-uniform effect in downweb (machine) and crossweb directions, it is not possible to perfectly align all three layers simultaneously. Registration errors also increase when attempting registration over larger areas. Thus such proposed methods are impractical and unworkable.

Another aspect of the present disclosure provides an improved method for eliminating ghosting in dual polarizing displays by incorporating density contrast compensation directly in each of the layers of the dual image, thereby eliminating both the need to print one or more additional filter layers and the requirement of laminating and registering these filter layers.

In an example of a method of the present disclosure, during the mask formation process, areas that will be totally clear in the dual image display are filled with a geometric or random pattern of lines, dots or other patterns such that average density of this area is equal to the minimum density (Dmin) of the rest of the image. Because this part of the image is formed along with the rest of the image, there will be no registration issues such as would occur with separately printed filters. Since both layers would have this integral anti-ghosting component, the problems associated with lamination and registration of a separate filter layer are eliminated.

An aspect of the present disclosure provides for printing the overlap regions of each separate image using geometries that give the maximum uniformity to the finished image in these areas. These can include half-tone type patterns, random small dots, or other patterns that provide visual smoothness and minimize disruption of the fill uniformity. If parallel lines are used for the gray-scale areas of the photomask, the directions for the two images should not be parallel or near parallel after lamination to also avoid moiré effects. Other complementary geometries can also be used to achieve smooth tones in these areas.

Misregistration: An undesirable by-product of the use of plastic substrates for printing in cases where registration of multiple images is required is registration errors resulting from the relatively low dimensional stability of most polymer-based films. The dimensional instability arises from thermal and mechanical effects, where for example the length and width of a film can expand or contract with temperature variations, and similarly with mechanical stress. These effects accumulate with distance, thus a small area of a pattern might be in acceptable registration with another small area of the mating film, but even as close as only several inches away the patterns may no longer be so registered. While a four color rotary printing press, for example, requires good color registration for all 4 colors, each color is printed consecutively on the same substrate, and adjusting the position of each color roller allows for corrections over large press runs, this cannot easily be done when two separate rolls are printed and then registered. It therefore may not be possible to register patterns on two separate sheets over even modest areas, such as 8×10-in print areas for example. It is therefore another aspect of this disclosure to provide an efficient method by which the image films that comprise the dual display (with or without separate ghosting correction films) can be combined with minimal mis-registration. This is done by printing a series a series of first images on an oriented PVA substrate so that the center, edge or other part of the repeating image for one polarization are aligned in the down-web (machine) direction, where this line of images can be repeated so that multiple such lines are also parallel to the film edge. A series of second images are similarly printed, on the same PVA roll or another roll, in this case with the images rotated 90 degrees relative to the orientation of the first images (and inverted if the two images are to be laminated face-to-face). After application of the dichroic dyes or ink and washing, the film is slit into single (or multi-image) rolls or panels and laminated.

The advantage of this method is that each image, being typically small (e.g., less than a few square inches) will have negligible dimensional deformation, and when laminated with another (orthogonally oriented) image, the overall mis-registration will also be negligible. Depending on the image size, multiple image panels can be treated as "single units" for lamination PVA Inking: In some versions of the commercial process used to make polarized films, the PVA layer is chemically treated either before during or after the dye step, using various chemicals such as such as boric acid and other cross-linking agents and/or other chemicals to improve process handling, scratch resistance, environmental stability etc. These treatments, however, significantly reduce the amount of ink (dichroic dye or iodine) that can be subsequently taken up by the PVA in post-process imaging processes, such as used in prior art techniques (e.g., Rowland, vecto, etc.), resulting in the formation of only faint images (i.e., having inadequately low density). It is therefore an aspect of the present disclosure to overcome this density limitation and produce images of significantly higher density by pre-treatment of the PVA layer using chemical treatments that counteract the dye uptake inhibition. Chemical treatments by strong alkali solutions (NaOH, etc.) or by H2O2 or other chemical agents prior to dye exposure have been found to enable increased dye uptake, resulting in light absorption increases of over an order of magnitude. Such treatments can be carried out by chemical bath immersion or by several of the known coating methods (flood, slot-die, rod, etc.), followed by rinse and/or neutralizing step to remove excess chemicals. This treatment can be carried out either before or, more conveniently, after the formation of the resist mask, followed by the dye imbibe step.

The resist mask used in the above embodiments can be removed or, in certain cases, left in place. For example, if the resist is a transparent UV resin or ink ('varnish'), then it can be left in place, offering further protection to the underlying image. Alternatively, it can be removed, such as by solvent swelling or dissolution ('lift-off'), or by mechanical means (stripping).

After the two components of the dual image are prepared, they are laminated face-to-face, in registration to one another. This is done by visual or machine alignment of fiducial marks incorporated into the original images. These can by typical marks used in the graphic arts field, or they can be designed for higher degree of registration, such as by moiré pattern alignment (Sullivan). Since the two mating surfaces are PVA, in the preferred embodiment of the present disclosure, a PVA-based aqueous adhesive solution can be very effectively used to permanently bond both images together, leaving the support layers (CTA, etc.) facing outward to act as image protection layers. Although less advantageous, UV or other adhesive materials known to the art can also be used to bond the two PVA layers together. This can be further enhanced by addition of UV or other anti-scratch hardcoat or fingerprint resistant layers, a particularly useful option for high usage automotive applications.

In another embodiment, selective color can be incorporated into the dual polarized image by using dichroic dyes that produce cyan, magenta, yellow etc. polarized images (Scarpetti) in combination with the black ink that forms the background. For example, after forming a background image with a black ink, removal of the resist to expose an un-dyed area would enable a colored dichroic dye to be used to stain the undyed area. Viewed through a polarized backlight, one layer would show a deep color in the otherwise clear area and a dark background of the layer for which the absorption is maximum (polarizer at 90 degrees), while the layer for which this orientation is parallel would be fully transparent. Rotation of the polarizer by 90 degrees would reverse the process and make the previously darkfield image (with color) fully transparent while the other image layer displays a color against a dark background. The image colors could be the same or different, in the latter case, for example, green for one condition and red for the other.

It is another an aspect of the present disclosure to use a resist material with sufficiently high adhesion to the PVA layer to prevent resist from delaminating during strip sheet separation or subsequent processing by pre-treatment with a solvent, such as isopropyl alcohol or other materials that can remove any PVA surface residue and/or slightly swell the PVA.

Polarized Lenses: A potential problem exists in using such displays when the viewer is wearing polarized sunglasses. Such glasses contain linear polarizers, so if the angle of one of the dual image layers is perpendicular to the polarization axis, that image will be dark, while the other is transparent, with the opposite being the case when the backlight polarization changes to the other polarization. It is an aspect of this disclosure to eliminate this problem by either of two methods. A first method is to orient the two images at 45 degrees clockwise with respect to the machine direction of the oriented substrate, and the other at 45 counter-clockwise to the machine direction, where the axis of polarization of the two backlights is rotated correspondingly. The second method for dealing with possible image cancellation when viewing the display through polarized sunglasses is to apply a quarter-wave retarder film over the front surface of the dual image display rotated at 45 degrees to either polarization axis, which will equalize the transmission of each image without selectively darkening one or the other.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Figure 1A:
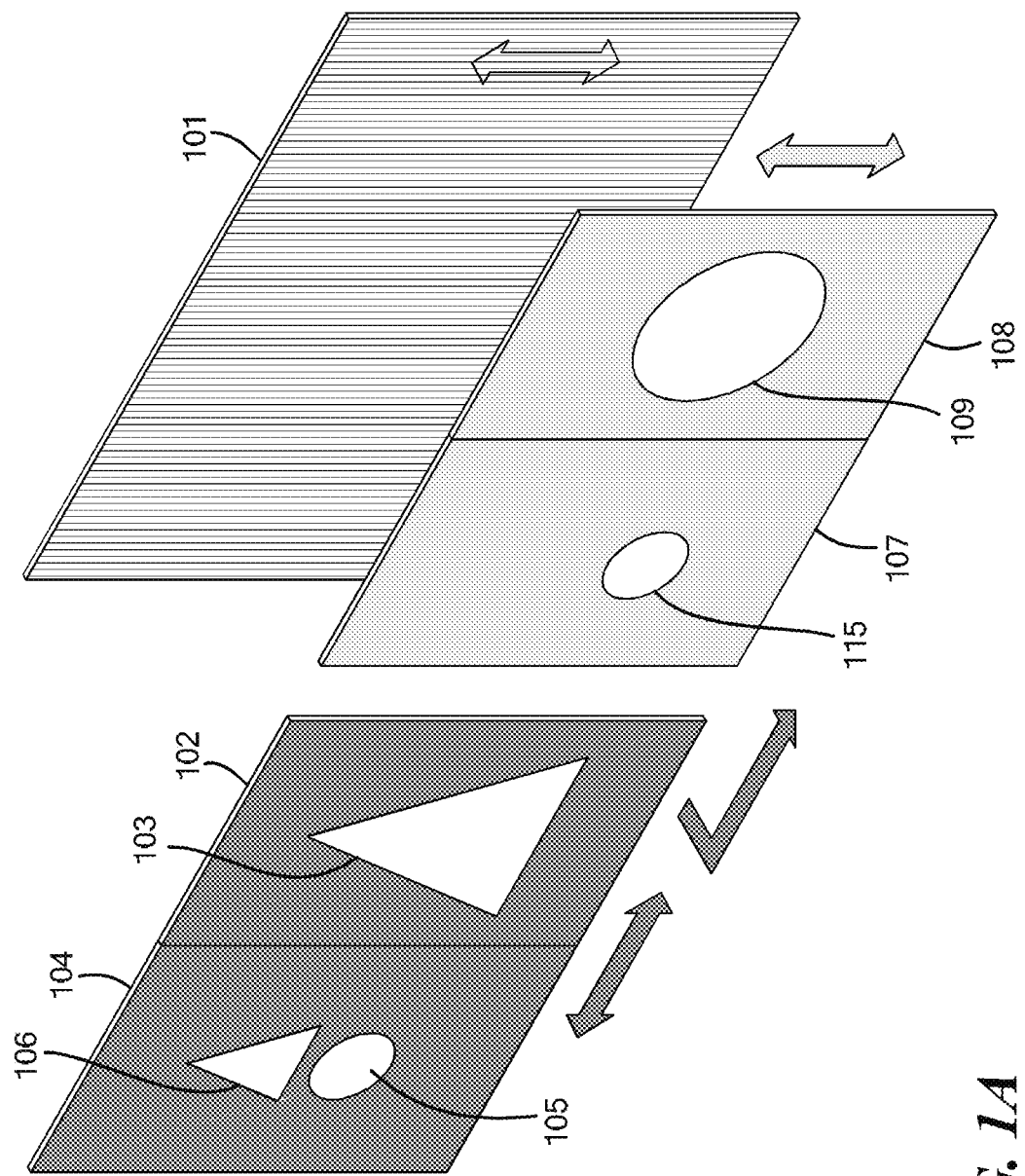
FIG. 1A depicts a prior art schematic of dual polarized image display concept showing one polarization state before lamination.
Figure 2A:
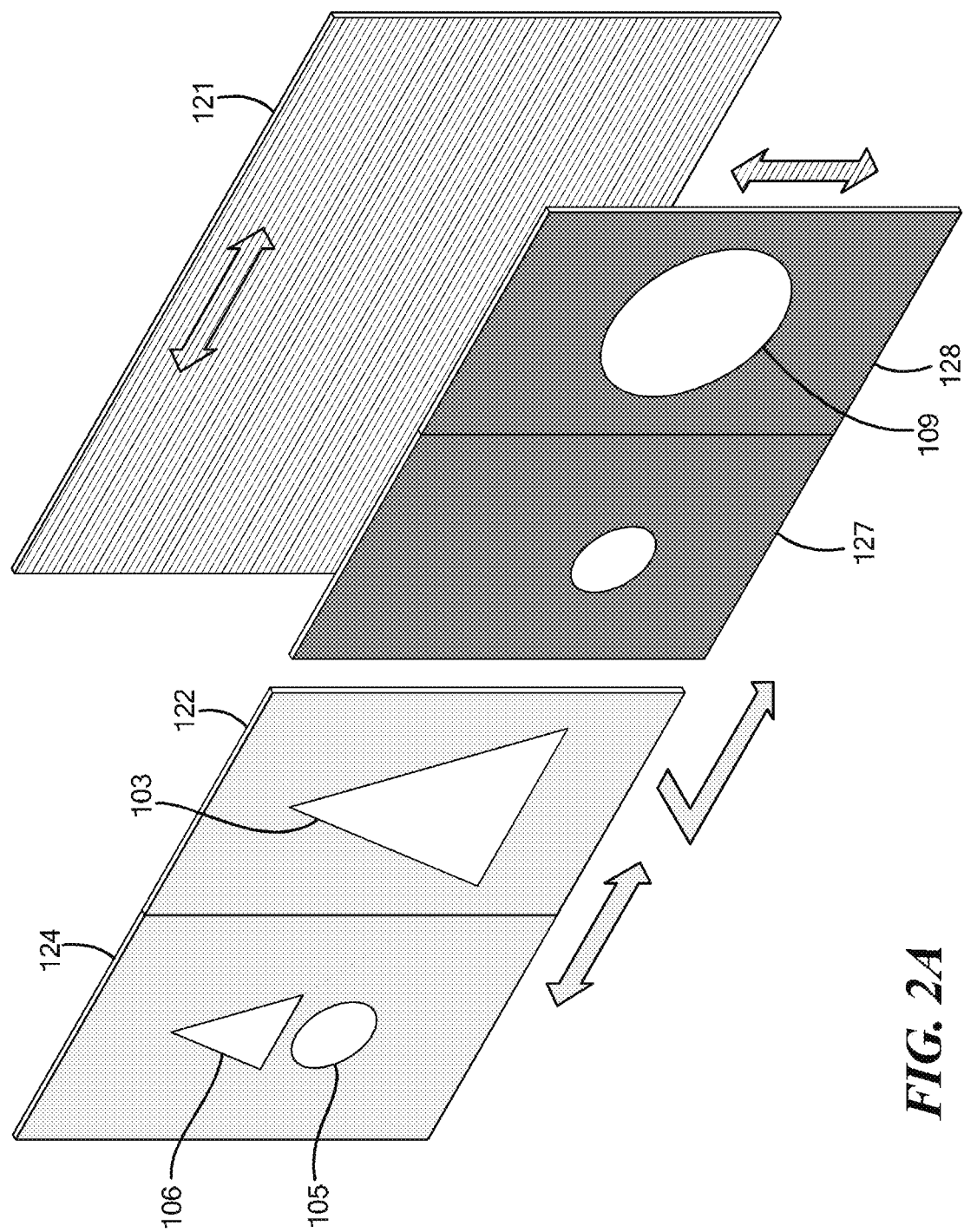
FIG. 2A depicts a schematic of a prior art dual polarized image display concept showing second polarization state before lamination.
Figure 2B:
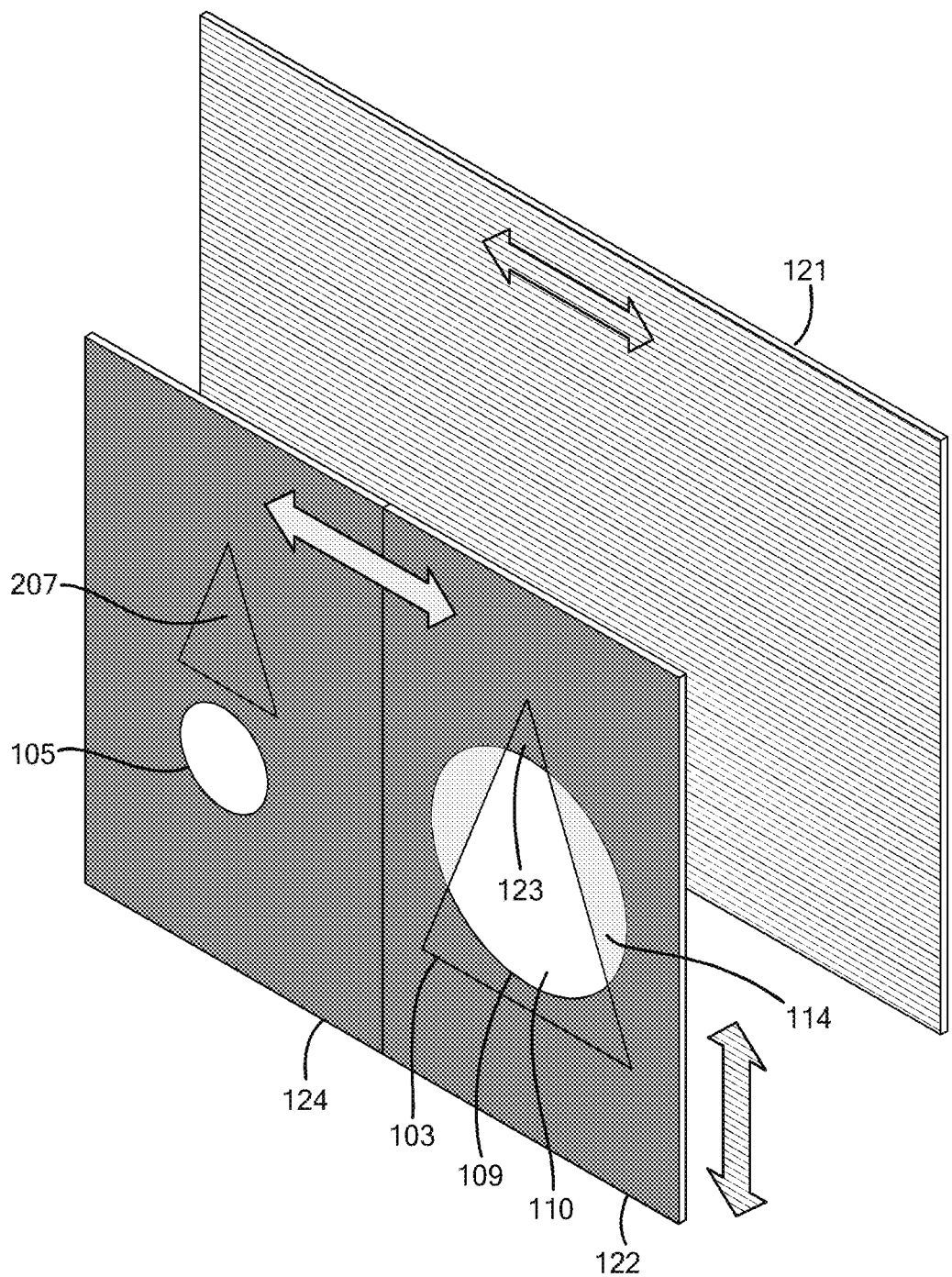
FIG. 2B depicts a schematic of a prior art dual polarized image display concept showing second polarization state after lamination.
Figure 3A:
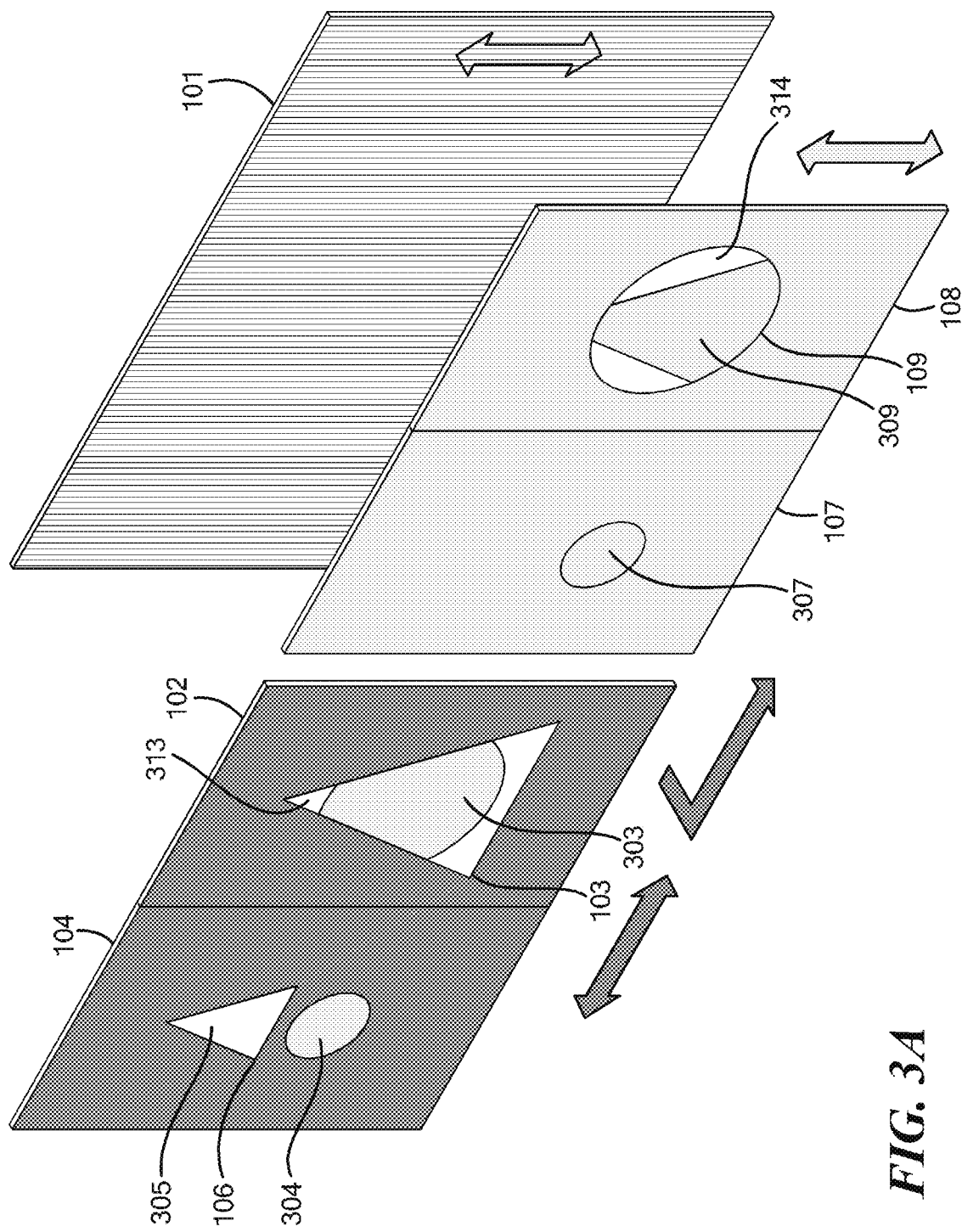
FIG. 3A depicts a schematic of a dual polarized image display with integral anti-ghosting showing first polarization state before lamination, in accordance with the present disclosure.
Figure 3B:
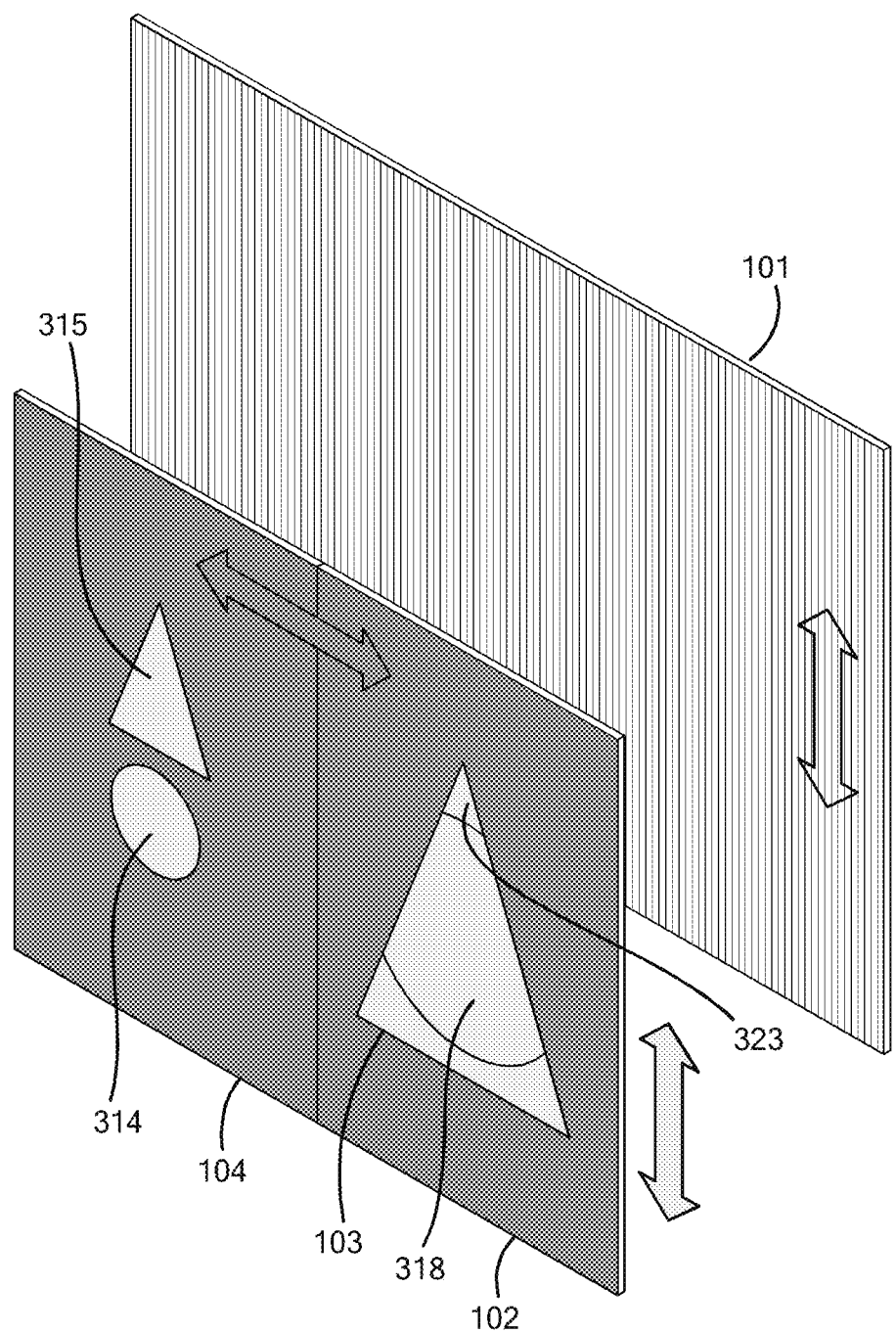
FIG. 3B depicts a schematic of a dual polarized image display with integral anti-ghosting showing first polarization state after lamination.

FIGS. 3A-3B depict examples of techniques for making dual polarized image films in accordance with an embodiment of the present disclosure. Panels 102/104 and 107/108 in FIG. 3A contain the same graphic information as shown in FIG. 1A depicting prior art. However, in this case small circle graphics 304 and 307 in panels 104 & 107, respectively, have a relatively small level of polarizing ink added to the image, as opposed to the 'binary' images in FIGS. 1 and 2. For the purposes of this discussion, we will refer to this 'ghost correction' density as 'Gmax' and 'Gmin', referring to the density of transmitted light in these areas when the polarized direction of the light source is perpendicular or parallel to the polarization axis of the panels, respectively. The overlap areas of graphic elements 103 and 109 in panels 102 & 108, 303 & 309, respectively, also contain a small amount of polarizing ink, while small triangle 305 has none and thus remains clear, as do non-overlapping areas 313 and 314.

Figure 1B:
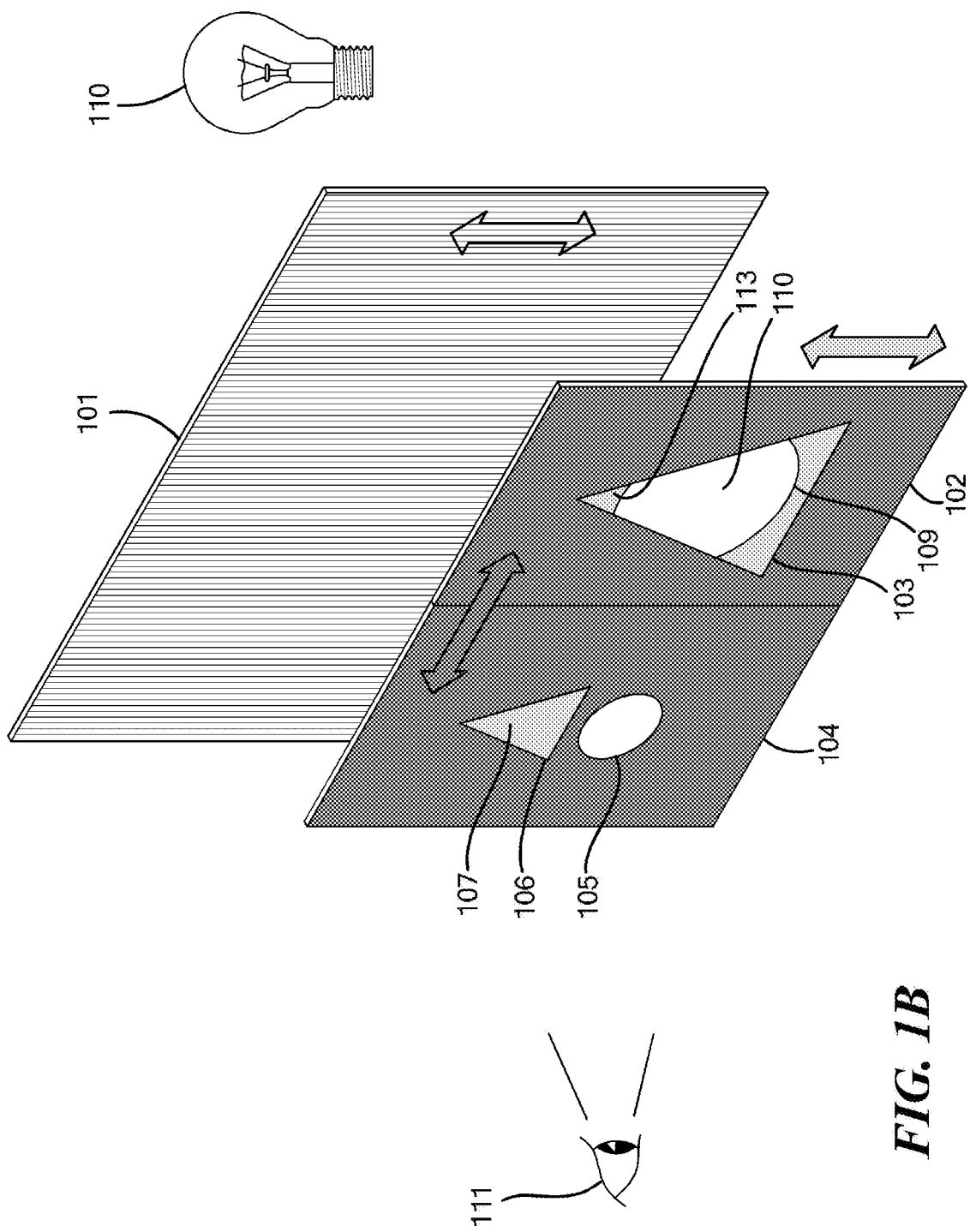
FIG. 1B depicts a schematic of a prior art dual polarized image display concept showing one polarization state after lamination.

In FIG. 3B, as in FIG. 1B, the left panel is overlaid onto the right panel. The optical densities of graphic elements 304, 307, 303 and 309 (FIG. 3A) are printed such that the sum of the densities of the overlapping graphics (i.e., 304+307, 303+309 [=Gmax+Gmin for each pair]) are equal to the background (no graphic elements) Dmin of panel 107/108. Therefore, it can be seen in FIG. 3B that the light transmitted through 315 (Dmin), 314 (=304+307) and 318 (=303+309) are essentially the same, and the ghost image seen in FIG. 1B is eliminated.

Figure 4A:
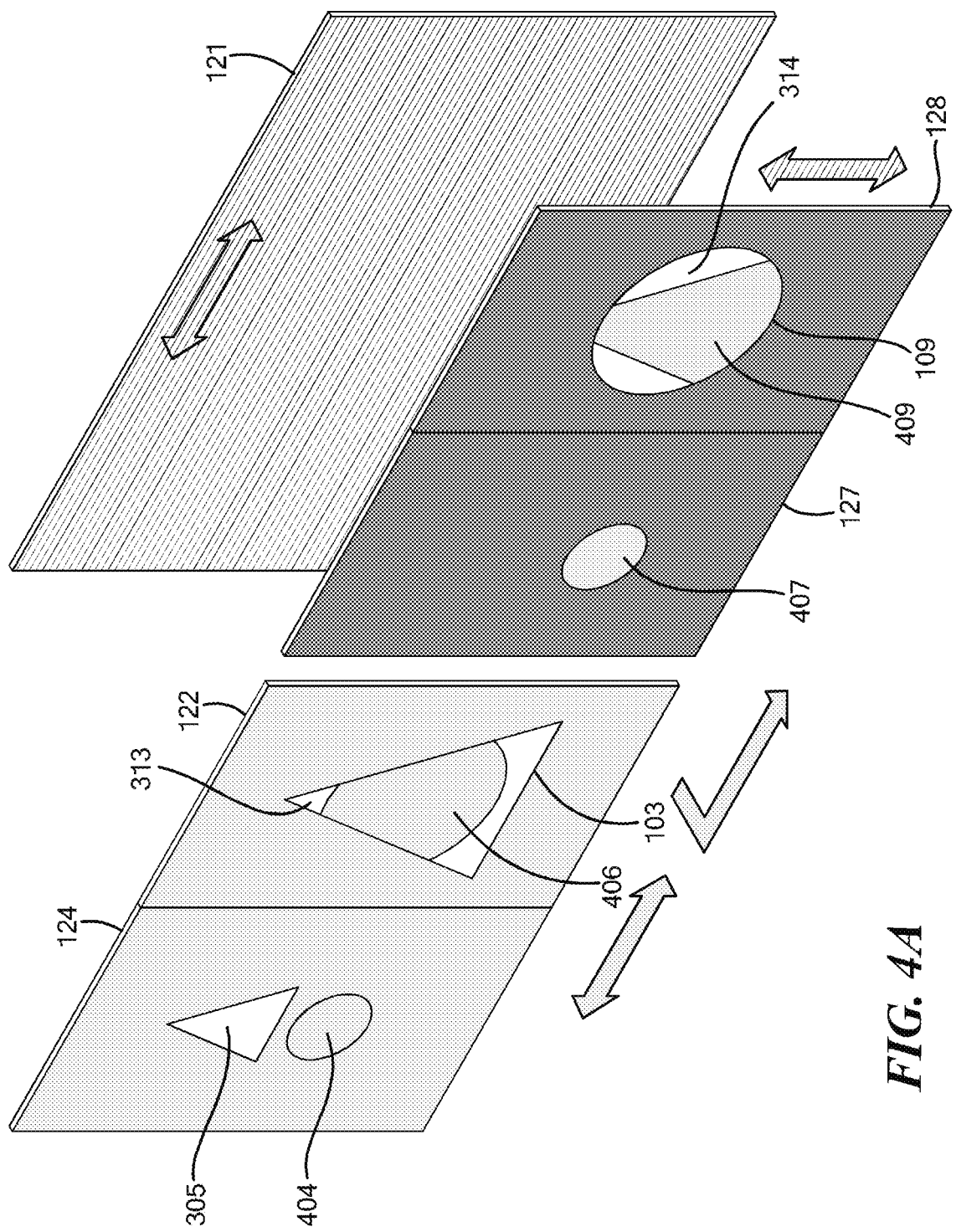
FIG. 4A depicts a schematic of a dual polarized image display with integral anti-ghosting showing second polarization state before lamination.
Figure 4B:
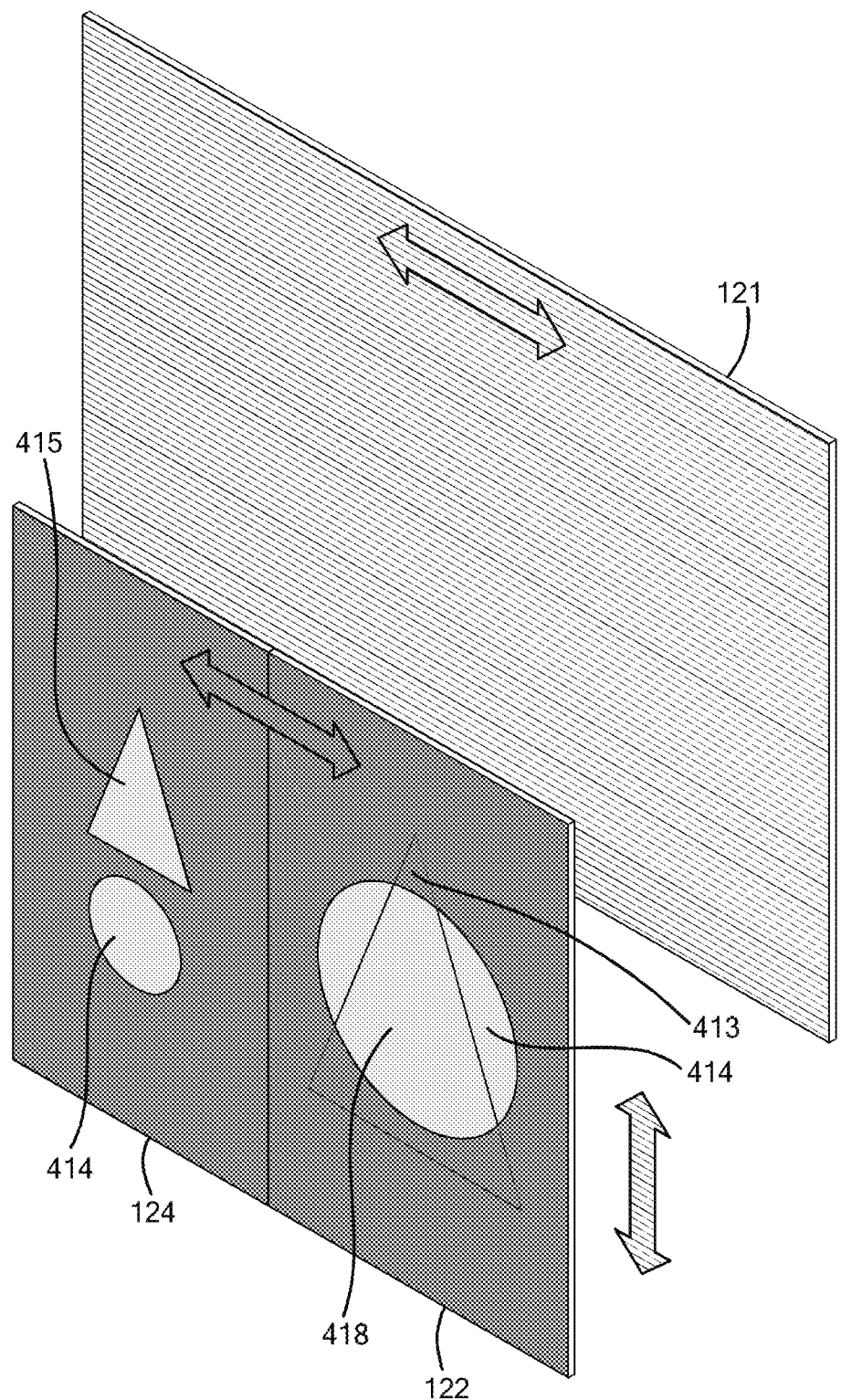
FIG. 4B depicts a schematic of dual polarized image display with integral anti-ghosting showing second polarization state after lamination.

FIG. 4A shows the same process as FIGS. 3A-3B, but in this sketch the polarization source has been rotated by 90 degrees. As in example in FIG. 3A, low density ink is applied to only the areas of overlap, viz. 404, 406, 407, 409. Non overlap areas 305, 313, and 314 are not inked. When the left panel is positioned over the right panel, again as in the previous case (FIG. 3B), the net optical density for this polarization is the same in areas 415, 414, 418 and 414, again eliminating the ghost image seen in the corresponding, non-corrected FIG. 2B (prior art).

Figure 5:
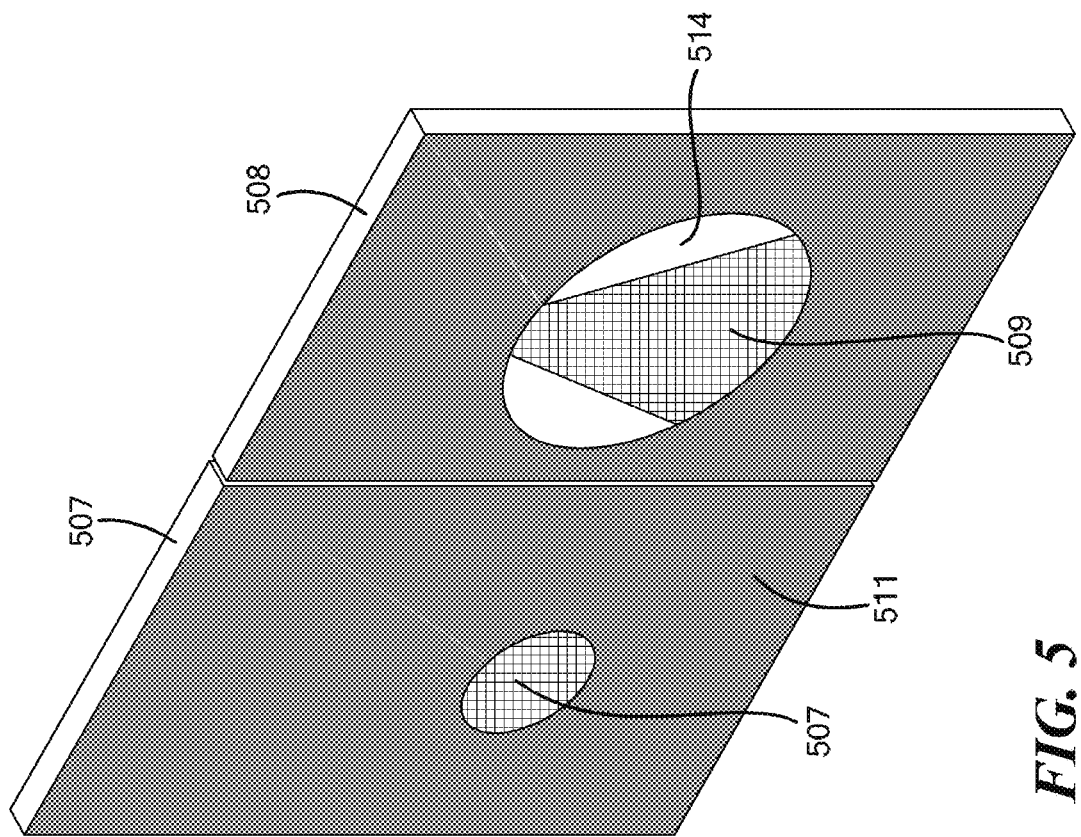
FIG. 5 depicts sketches of photomasks for resist mask formation.
Figure 5:
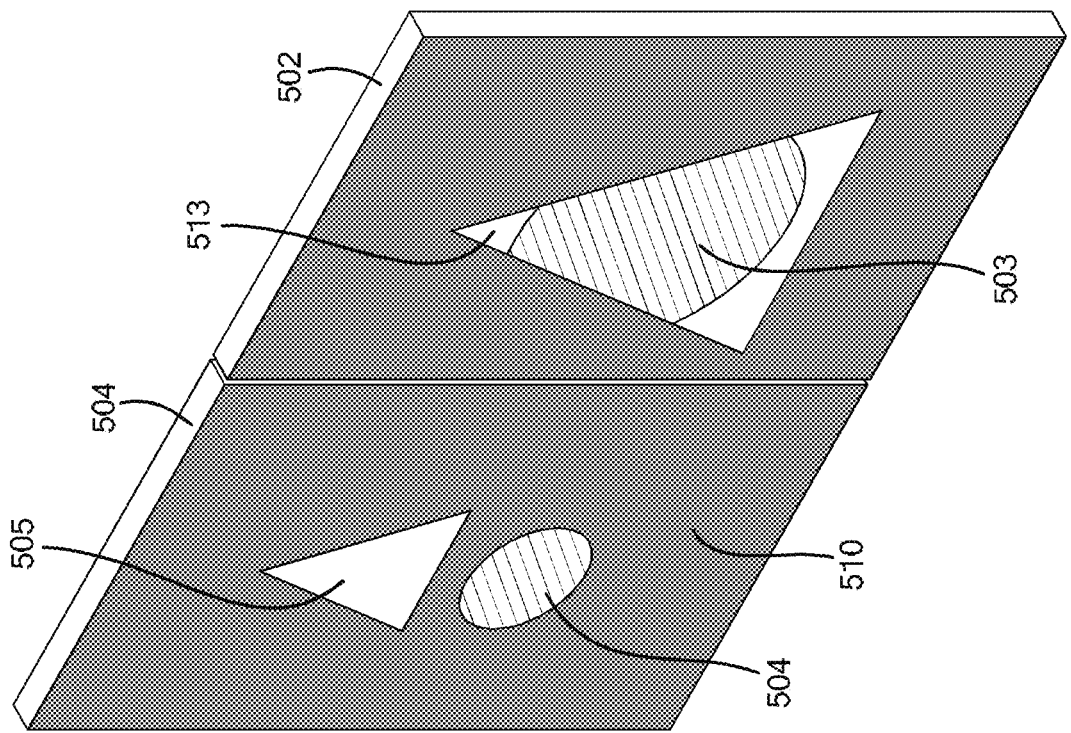

FIG. 5 shows a set of dark field photomasks used to form the resist patterns for producing ghost-free dual polarized images. The photomasks comprise clear support 504/502 and 507/508 and include three types of apertures: clear for non-overlapping image areas (505, 513, 514), gray-scale (pattern) for areas of complete image overlap (503, 504, 507, 509), and opaque (510, 511) for non-image areas. When a layer of a photosensitive resist is exposed through such a mask, the resist exposed through the clear aperture areas is totally cross linked and presents a barrier to subsequent inking. Areas without resist will be completely inked. Although photomasks can be binary (transparent or opaque areas) or gray-scale (areas of variable density), the photoresist that forms the resist mask operates in a binary manner only—either it is crosslinked or it is not crosslinked, thus the underlying areas are either protected or not and do not operate in an intermediate state. For this disclosure, the overlap (gray-scale) areas of the resist will be formed using photomasks that have very fine features in that they cannot be resolved by eye. For these areas, the relative fill (i.e., the ratio of the opaque to transparent areas) will determine the area of the PVA that will be covered and uncovered by resist, with only the uncovered area taking up ink. For the mask, these areas can be filled with fine parallel lines, checkerboard patterns, random or periodic dots, or any other fill geometries that allow the exposed resist to partially cover the overlap area.

Figure 6A:
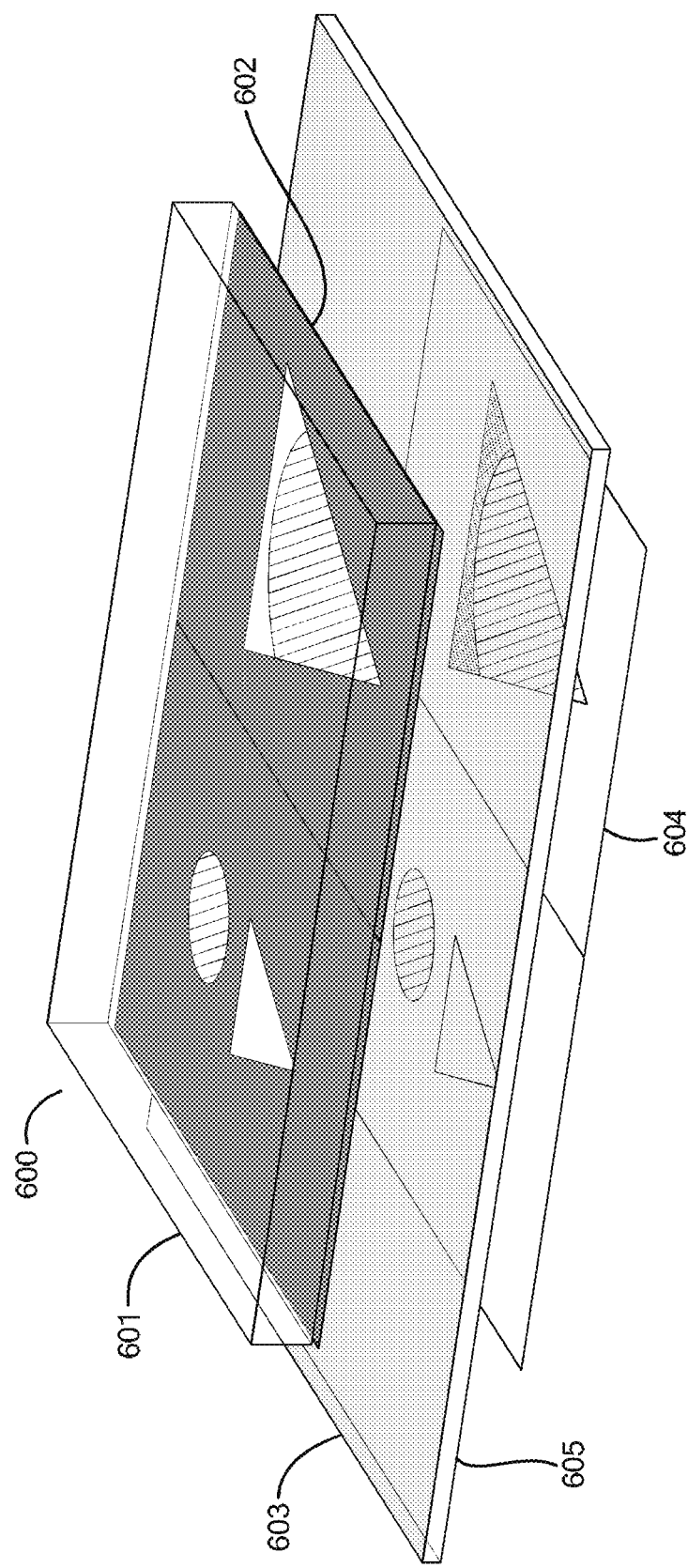
FIG. 6A depicts an exploded view of resist formation using photomask and interleave film.

FIG. 6A is an illustration of a photomask being used to form a ghost-free resist pattern for polarizer inking. Here, photomask 600 comprised a transparent glass support 601 with an area 602 with transparent, opaque and gray-scale features. A thin layer of resist, in this case a liquid adhesive (such as commercially available acrylic-based or other "UV Cure" adhesives from Loctite, Dymax, Norland Adhesives, and in particular Pincus Associates PAI-430B; resist is not shown for clarity) is spread between thin transparent cover sheet 605 and oriented PVA substrate 604. This can typically be accomplished by pressure lamination or any other method that forms a relatively uniform polymer layer without trapped air bubbles. Photomask 601 is placed in contact with the 605/(resist)/604 laminated structure, where it is beneficial to use an index matching fluid between 603 and 602 (not shown for clarity) to minimize reflections and light scattering. A minimum separation between the photomask and the PVA will produce the highest resolution resist image, thus thin coversheet films (605), such as PET (polyethylene phthalate), PEN (polyethylene naphthalate), etc. at less than 25 μm are preferred. Radiation of the appropriate curing wavelength for the UV adhesive resist is passed through the photomask 601 into the resist layer with sufficient energy to crosslink the resist under the transparent areas. It is important not to overexpose the resist, and light leakage will broaden the fine features in the overlap area and produce less density during inking (and also enlarge the borders of the mask area).

After exposure, the photomask 601 is removed, as is the coversheet 603. The residual polymer that has not been exposed is then removed, typically by rinsing or immersion in a bath containing a solvent that does not attack the cured resist but dissolves any uncured material. Such mild solvents as isopropyl alcohol, for example, can be used to remove this residue.

Figure 6B:
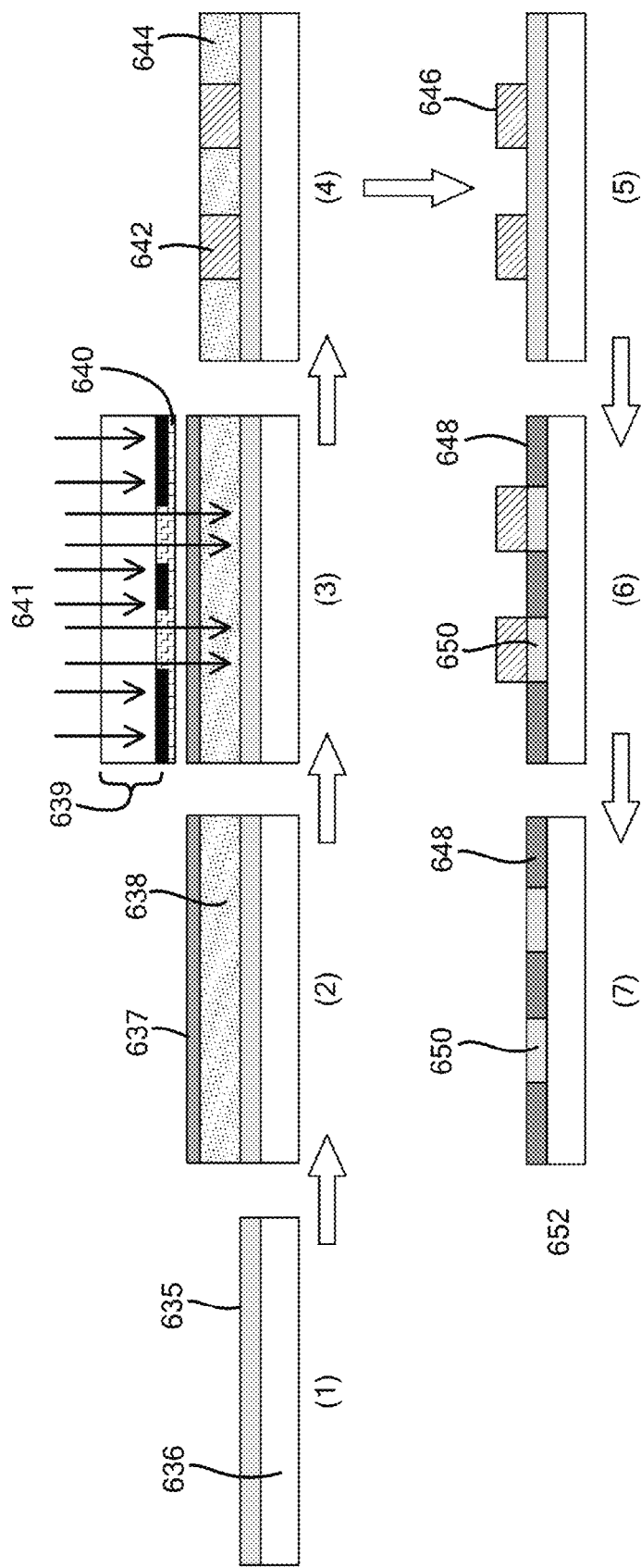
FIG. 6B depicts a schematic of a process for forming resist pattern using photomask.

The photomask process is illustrated schematically in FIG. 6B, starting with an oriented PVA film 635 on support (cellulose triacetate, CTA or other), (step 6b-1), after which the photosensitive resin 638 is laminated to 635 using thin coversheet 637 in step 6b-2. Photomask 639 is laminated to thin cover sheet 637 using index matching fluid 640, step 6b-3, followed by UV exposure (641). Step 6b-4 shows cross linked poly mask 642 and non-cross linked areas 644. After washing of the uncured polymer 644, resist patterned PVA (646) remains (step 6b-5). Dichroic ink is then applied, producing imbibed areas 648 and non-inked areas 650 shown in step 6b-6. After (optional, especially of clear) removal of the resist, step 6b-7 shows the dyed PVA 652 with polarizing areas (650) and non-polarizing areas (648).

Figure 7:
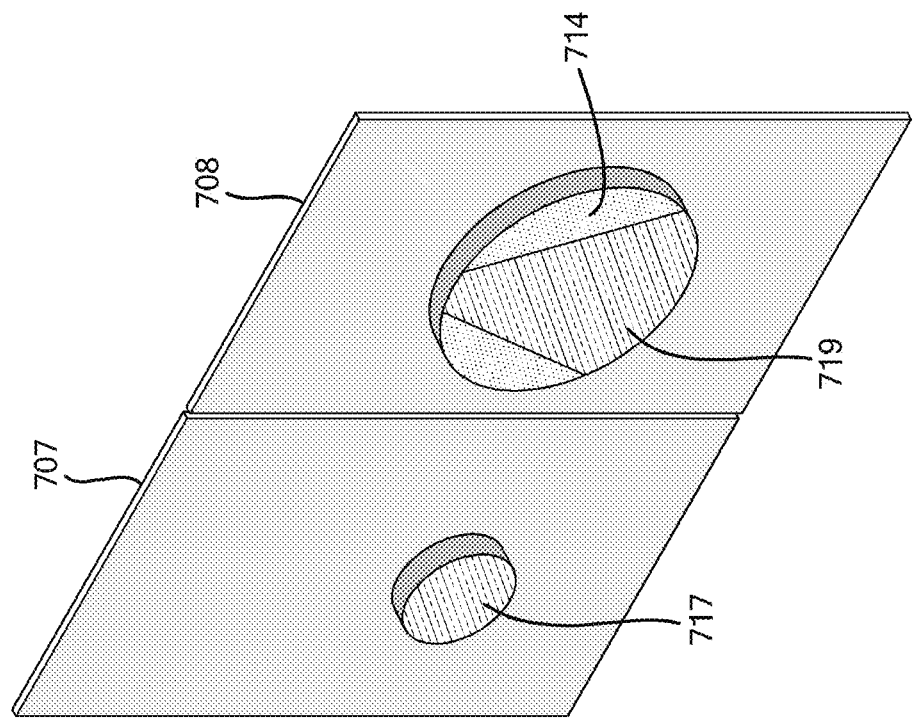
FIG. 7 depicts a schematic of layers after application of polymer resist.
Figure 7:
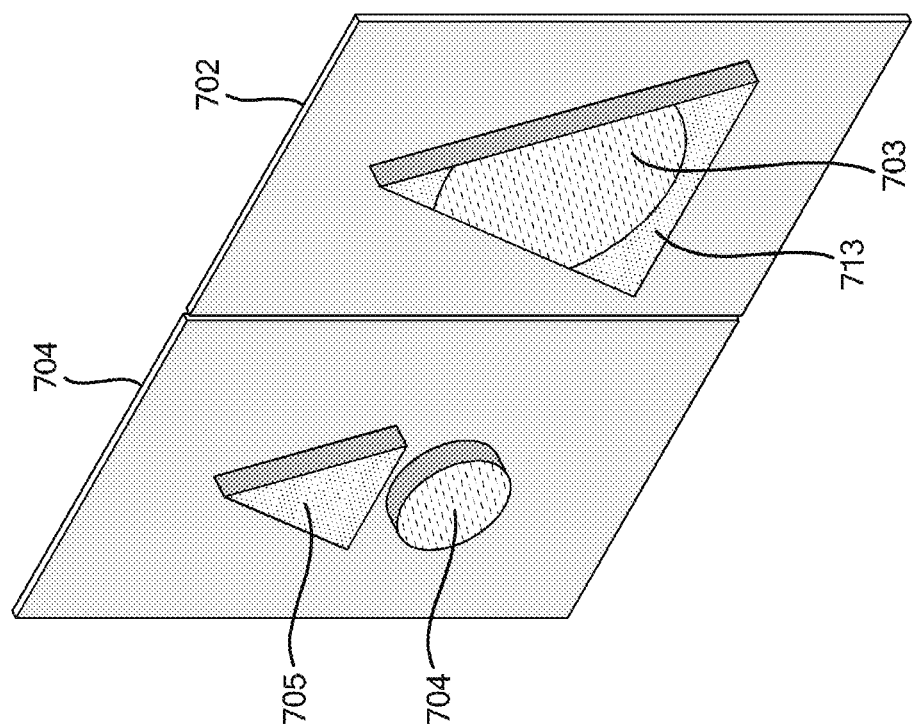

Another method for forming the ink-resisting mask is shown in FIG. 7. Here panel 704/702 and 707/708 are PVA film substrates on which image elements 703, 704, 705, 713, 717, 719, 714 have been formed by ink jet printing, using either solvent-based or UV-cured inks (the thickness of these patterns has been exaggerated for illustrative purposes only). Similar to the photomask process, three types of images are printed: non-overlapping areas 705, complete overlap areas 704, 717, and partial overlap areas 703/713 and 714/719. The density and pattern of the applied dots, as in the photomask case, determines the amount of ink that will be taken up in the overlap areas. Likewise, the patterns in the overlap regions of each panel should be complementary (orthogonal, moiré-free patterns) and of sufficiently high resolution to allow a smooth, uniform appearance of the gray areas. It should be noted that this method can also be used in a subtractive manner, i.e., using an already inked PVA sheet (a sheet polarizer) for 702/704 and 707/708 and, after resist formation, exposing the resist patterned film to a bleach solution (such as a strong base such as NaOH, etc.) in order to react with the iodine or dichroic ink to produce clear, non-polarized areas where there is no resist. This will produce the negative of the image formed by inking of un-dyed PVA, where a clear-field photomask in the subtractive case will yield the same image tone as the inked case.

Figure 8:
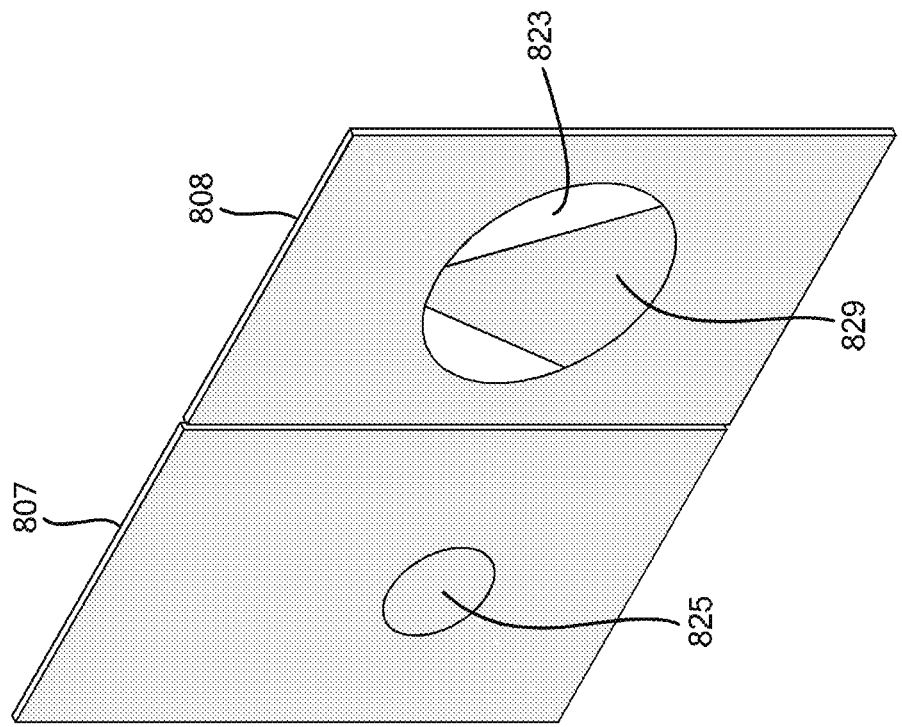
FIG. 8 depicts a schematic of dual image layers after ink application.
Figure 8:
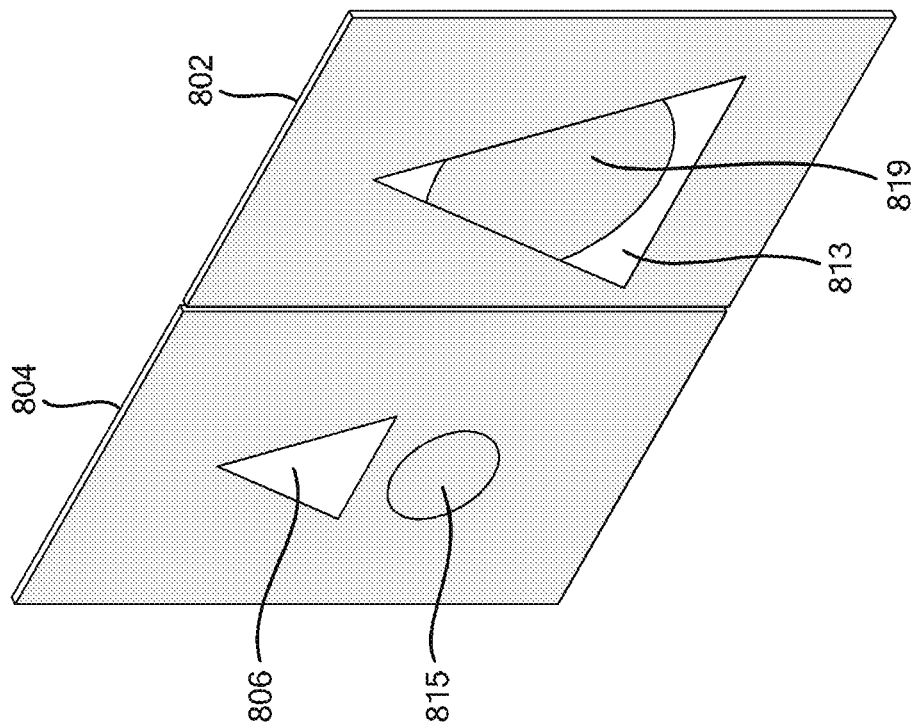

FIG. 8 shows the panels in FIG. 7 after being exposed to polarizing ink, where areas 806, 813 and 823 have had no ink uptake, areas 815, 825, 819 and 829 have low (Gmin) density due to gray-scale inking. All non-resist coated areas (i.e., the remainder of the panel) will take up maximum ink, and without illumination by polarized light will exhibit the Dmin state.

Figure 9:
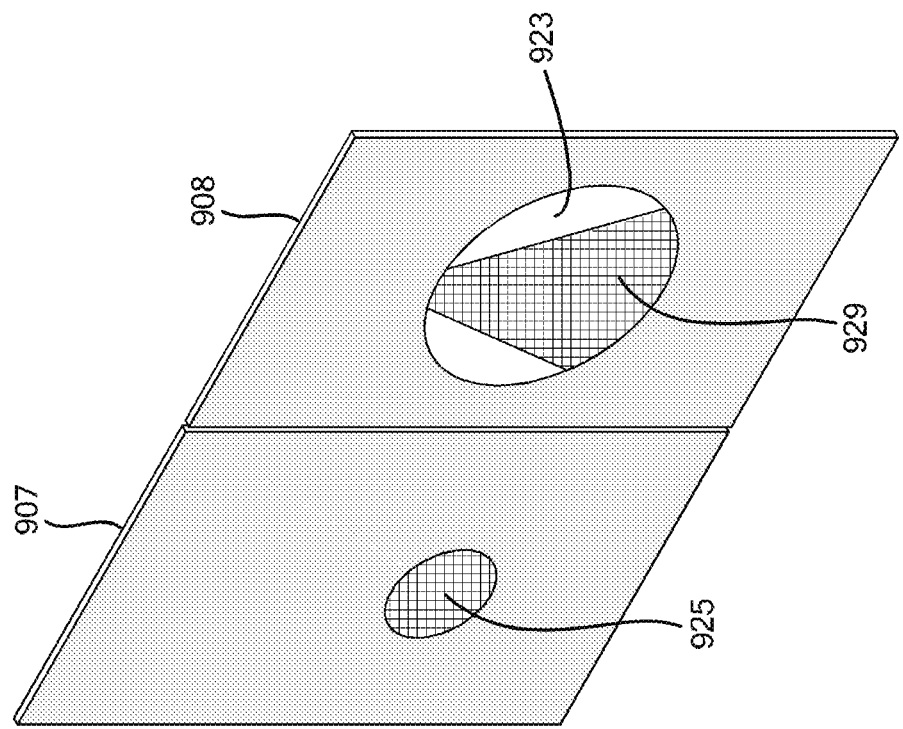
FIG. 9 depicts a schematic of direct ink jet application with anti-ghosting.
Figure 9:
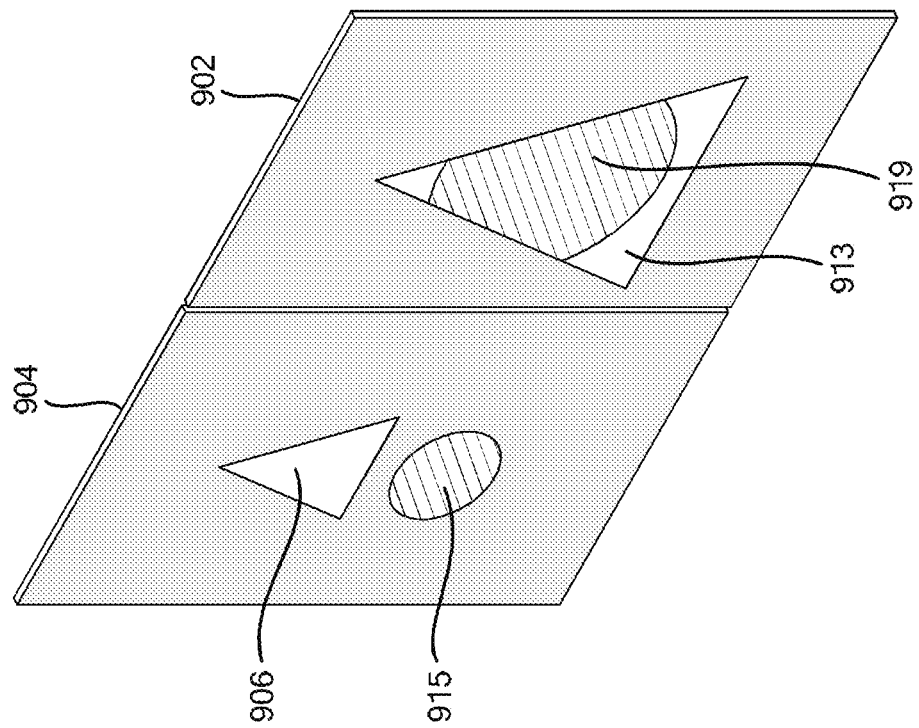

It is also an aspect of the present disclosure to use the anti-ghosting procedure described herein with direct printing of dichroic dyes onto PVA substrate films. FIG. 9 shows such films, where the background (all areas without graphics) area is printed with full ink density, the non-overlap areas 906, 913 and 923 have no ink density, and the overlap areas 915, 925, 919 and 929 have Gmin density levels.

It is also an aspect of the present disclosure that, either before or, preferably, after the resist masks shown in these Figures is formed, the PVA may be treated with chemicals or treatments to increase the rate and/or ability of the PVA to take up dichroic inks (dyes and iodine stains), such as by the use of concentrated aqueous NaOH (10-40%), H2O2 (10-30%), alone or in combination, and/or other chemicals that decrease the cross lining of the PVA or otherwise increase it dye take-up ability.

Another method of the present disclosure to reduce or eliminate ghost images in dual polarized displays is the use of an additional layer, separate from either of the polarized image layers, to carry the anti-ghosting pattern. In the simplest version, this layer comprises a transparent film either on the back (illumination) side of the laminate, or between the individual image layers, or on the front surface, where the front surface is preferred because any residual stress in such a film in the other positions, being effectively located between two polarizers (the illumination source and one of two images) could distort the image due to birefringence induced from the film's stress.

As mentioned previously, the incorporation of additional layers having the overlap image information as a means to reduce ghosting requires that such layers be carefully registered to prevent light leakage from clear areas that are not completely covered. This can be very difficult due to the inherent dimensional instability of most plastic films. Therefore, another aspect of the present disclosure is to use self-alignment to create the anti-ghosting fill layer, thereby eliminating any such misalignment. Here, the laminated dual image film (without backside polarizer) is used as a photomask to expose a photosensitive layer of colorant (e.g., UV activated ink) or resist coated on the front side of the dual image using illumination from the back side. In this method, a maximum amount of light passes through the clear areas of the dual image (i.e., those areas that result in ghosting), a lesser amount passes through the areas having a clear area overlapping a polarized image element, and virtually no light passes through areas with no image elements. By adjusting the light exposure so that the radiation flux through the polarized areas is below that required to activate the resist or cure the UC color ink in such areas, only the clear areas will produce an adequate exposure of the resist or ink to cause resist activation or ink cross linking, respectively. In the case of the UV ink, the intensity and color of the ink are selected to match the Dmin or either of the dual images, and after exposure the un-crosslinked ink is removed by solvent rinsing. For a positive tone photoresist (where light exposure cause the exposed area to become developable and therefore removed), the exposed area can be dyed with any dye compatible with the film upon which it is coated, after which the remaining resist is removed by typical stripping methods.

For the UV ink method described above, the amount of ink used can be minimized by applying it only in, and slightly beyond, those areas that have clear openings, since the remaining areas of the image will not require any ink fill.

Another aspect of the present disclosure provides a technique in which the front film is oriented PVA (with or without additional support films) that is rotated at approximately 45 degrees relative to the polarization axis of the dual laminated image pair, and an iodine or dichroic dye is used to form the anti-ghosting element. For this case, the density of this area is adjusted to match the Dmin of the image pair, while using the same dichroic ink or iodine stain will produce the matching color. This requires a positive resist to form the anti-ghosting area to be dyed, or a pre-inked film and the bleaching process for a negative tone resist (i.e., UV inks).

An exemplary embodiment of the present disclosure is a method to provide a means of minimizing mis-registration effects that result from dimensional distortion that can occur when combining two or more films that contain images that require precise registration. Dimensional instability in polymer films, which results from thermal expansion and contraction, bi-directional stresses, etc., tends to be a longer range effect. For example, an 8½×11-in PVA-CTA laminated film that contains images requiring registration to another such sheet could easily have several thousandths of an inch substrate distortion over this size range, thus while an image pair may be well aligned in one corner after lamination, the diagonally opposite corner would likely have areas that are visibly misregistered. A method to minimize this effect is to slit the roll of images into a roll that is a single image (or a small set of images) wide, with one roll for each of the two polarization orientations. Since the PVA orientation direction is always in the film travel direction, one member of the pair of images is printed in this orientation, while the other is printed at 90 degrees to this orientation. In addition, printing one of the pair backwards (mirror image) will allow the two films, when oriented in a 90 degree film direction, to be laminated face-to-face to protect the images from physical damage.

Figure 10:
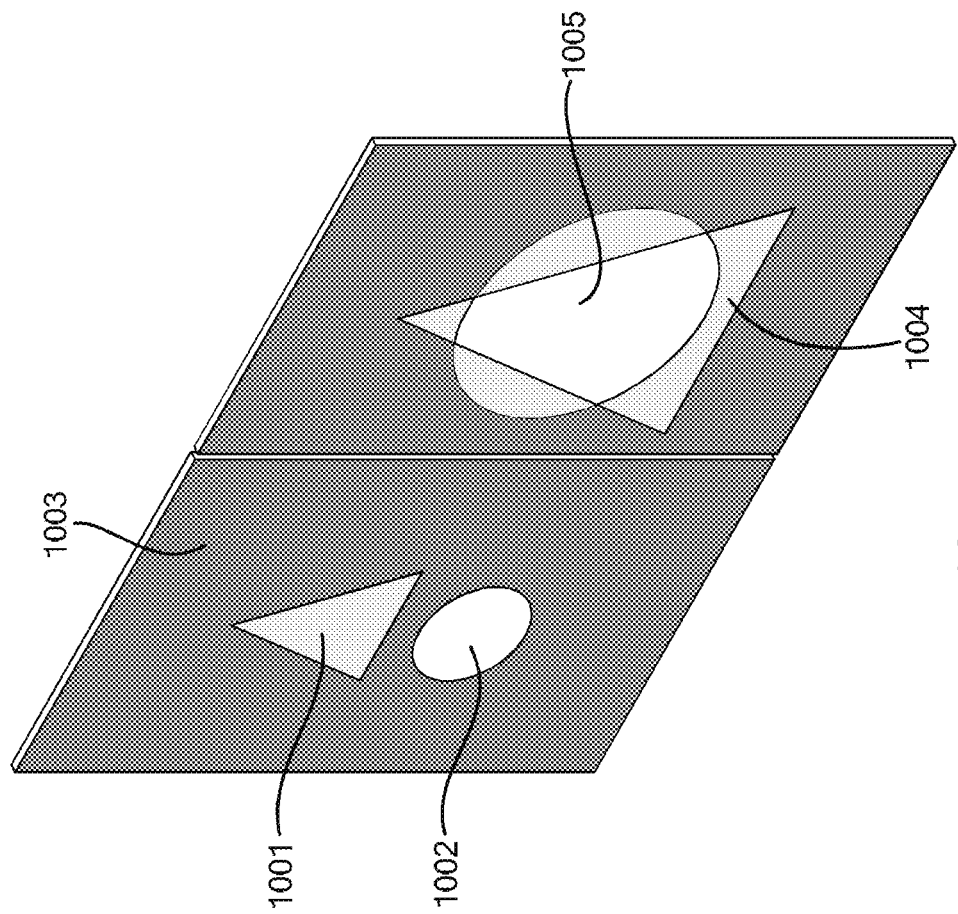
FIG. 10 depicts a schematic of use of dual polarized image film as self-alignment photomask.

FIG. 10 illustrates a method for eliminating anti-ghosting layer registration errors by using the laminated dual image film as a self-aligned mask. Area 1003 represents the areas with no image elements and comprises two orthogonal polarized films and is therefore very dark (Dmax). Areas 1001 and 1004 are areas in which a clear element overlaps a non-image area and therefore have density Dmin. Areas 1002 and 1005 are completely clear. A layer of tinted (non-dichroic) UV ink with a density of Dmin coated directly over the front side of this area (or on a laminated film) and exposed through the opposite side of the film (process not shown) will form an aligned anti-ghost fill area. Alternatively, an oriented PVA film rotated at approximately 45 degrees with respect to the polarization axis of the dual film can be used with a positive resist for dichroic dyeing of the uncovered area or with a negative resist for bleaching of a pre-dyed substrate (not shown).

Figure 11:
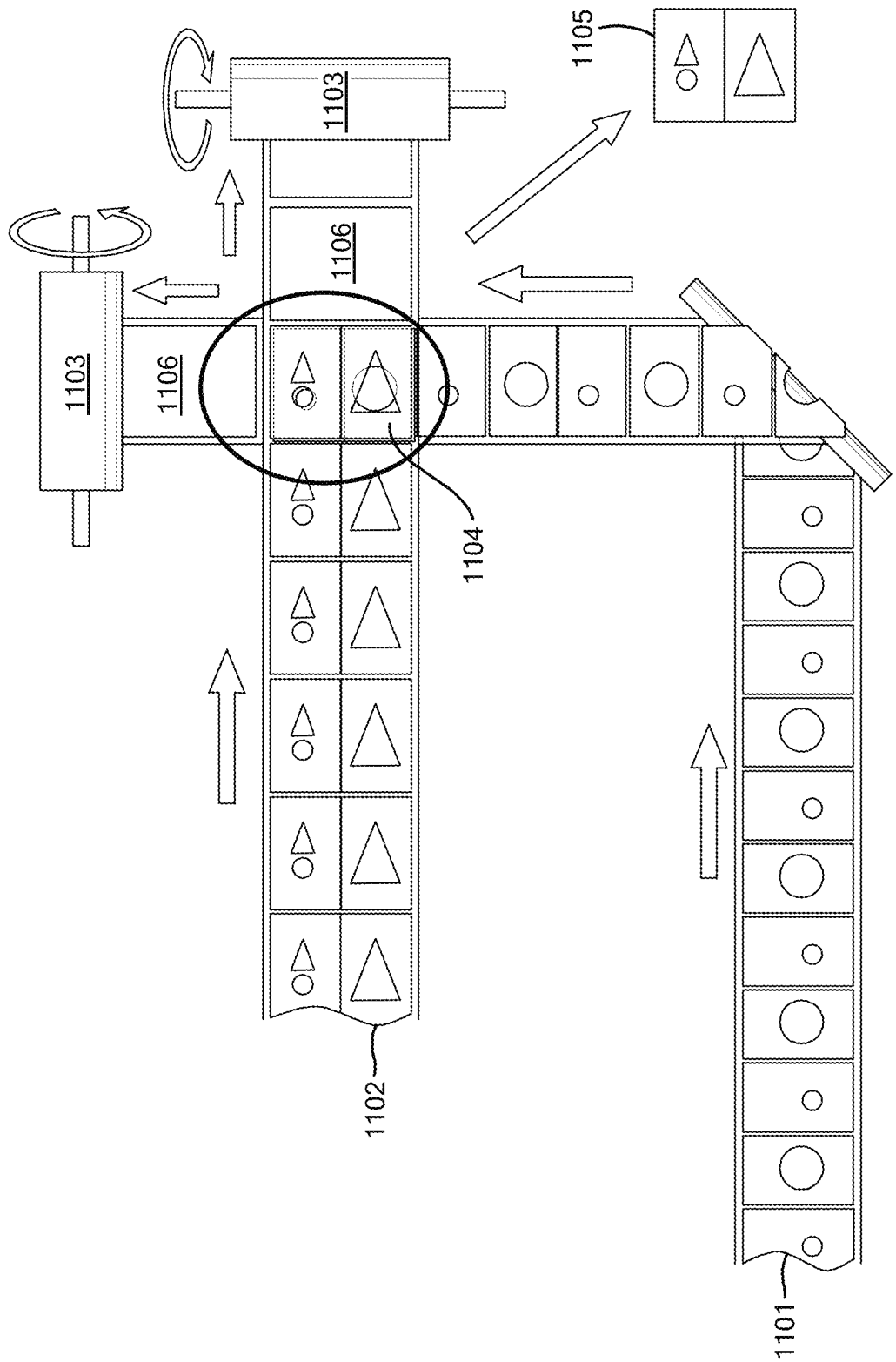
FIG. 11 depicts a schematic of process for producing dual image films with minimized registration errors.

An example of a method for minimizing registration errors caused by substrate dimensional distortion is illustrated in FIG. 11, wherein image film strips 1102 and 1101, having been formed with polarization directions orthogonal to one another and slit from a wider printed roll (not shown), are brought together at intersection point 1104. At this location, the x, y and theta (displacement and rotation) positions are adjusted by standard mechanical displacement means so that the images are registered to one another. An interposed liquid bonding solution (e.g., a dilute solution of PVA in water with surfactant or a UV curable adhesive, etc.) is applied prior to lamination (not shown) and the laminated films are allowed to bond (by sufficient set up time or by UV exposure, respectively). The laminated area is cut out at location 1104 by means of dye cutter, blade, laser cutter, etc. (not shown) outside of the lamination area and the laminated image 'chip' 1105 is removed. This can be further trimmed to remove any excess or non-laminated area, and the remaining 'matrix' areas 1106 wound onto take-up spools 1103. Other (non-rewind) means of indexing and advancing the film can also be used. The individual slit spools can contain multiple lanes of images, as long as the area within the finished 'chip' is small enough so as not to exhibit sufficient dimensional distortion to cause registration errors.

Unless otherwise indicated, formation of particular shapes or control of processing steps that have been discussed herein can be (and are in exemplary embodiments) implemented with a specially-configured computer system specifically configured to perform the functions that have been described herein for the component. Each computer system includes one or more processors, tangible memories (e.g., random access memories (RAMs), read-only memories (ROMs), and/or programmable read only memories (PROMS)), tangible storage devices (e.g., hard disk drives, CD/DVD drives, and/or flash memories), system buses, video processing components, network communication components, input/output ports, and/or user interface devices (e.g., keyboards, pointing devices, displays, microphones, sound reproduction systems, and/or touch screens). Each computer system may include software (e.g., one or more operating systems, device drivers, application programs, and/or communication programs). When software is included, the software includes programming instructions and may include associated data and libraries. When included, the programming instructions are configured to implement one or more algorithms that implement one or more of the functions of the computer system, as recited herein. The description of each function that is performed by each computer system also constitutes a description of the algorithm(s) that performs that function. The software may be stored on or in one or more non-transitory, tangible storage devices, such as one or more hard disk drives, CDs, DVDs, and/or flash memories. The software may be in source code and/or object code format. Associated data may be stored in any type of volatile and/or non-volatile memory. The software may be loaded into a non-transitory memory and executed by one or more processors.

The components, steps, features, objects, benefits, and advantages that have been discussed are merely illustrative. None of them, or the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, various other types of polarizers can be used, including wire grid polarizers, silver nanowire polarizers, etc. Patterns and graphic images can also be introduced into dual and single layer polarizing films to incorporate logos, security feature patterns, secret images and information, bar codes, etc. In addition, half-tone and gray-scale masks can be used to produce gray-scale polarizers and gray-scale polarized images, just one example being gradient polarized sunglasses (i.e., to provide non-polarizing areas of the sunglasses through which polarized element-containing displays can be viewed without introducing polarization-related image distortion). Furthermore, incorporating polarized image areas and non-polarizing (non-dichroic dyed) images having the same color and density as the dichroic image areas would allow otherwise hidden images to appear only when a polarizing film at the correct angle is introduced into the light path. Other optical configurations for viewing such dual image films are possible, such as back illumination by a non-polarized light source and viewing using a polarizer between the films and the viewer, whereby rotation of this polarizer will cause the viewed image to change.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

What is claimed is:

1. A method for creating a laminated structure configured to display alternate images by switching polarization of a backlight source, and without the use of glasses by a viewer, the method comprising:
   providing a first polarizing material layer;
   forming, over the first polarizing material layer, a polymeric first relief mask having predetermined areas open to the underlying first polarizing material layer;
   forming selective polarization patterns corresponding to alternate images by selectively removing polarization creating material from or selectively adding polarization creating material to the areas in the first polarizing material layer exposed by the predetermined areas of the first relief mask, wherein a first patterned polarized image layer is produced;
   providing a second polarizing material layer;
   forming, over the second polarizing material layer, a polymeric second relief mask having predetermined areas open to the underlying second polarizing material layer;
   forming the selective polarization patterns corresponding to the alternate images by selectively adding polarization creating material to or selectively removing polarization creating material from the areas in the second polarizing material layer exposed by the predetermined areas of the second relief mask, wherein a second patterned polarized image layer is produced; and
   laminating the first and second patterned polarized image layers together, forming the laminated structure such that the polarization axes of the layers are perpendicular;
   wherein the laminated structure is operative to display the alternate images in response to switching a polarization of the backlight source, and without the use of glasses by a viewer;
   wherein the first polarizing material layer includes a stretched oriented polymer;
   wherein polarization is produced in the stretched oriented polymer by imbibing therein a polarization creating material; and
   wherein the polarization creating material contains one or more dichroic dyes.

2. The method of claim 1, wherein the first polarizing material layer includes a dye-imbibed oriented polymer polarizer, a wire grid polarizer, or a oriented silver nanoparticle polarizer.

3. The method of claim 1, wherein the oriented polymer is polyvinyl alcohol (PVA).

4. The method of claim 1, wherein the polarization creating material includes an iodine containing solution.

5. The method of claim 1, wherein the one or more dichroic dyes are selected to produce any of polarized colors cyan, magenta, yellow, red, green, blue and black.

6. The method of claim 1, wherein the degree of polarization is controlled by the degree of imbibition of the polarization creating materials.

7. The method of claim 6, wherein the degree of polarization is controlled by one or more of polarization material concentration, temperature, dwell time, chemical additives.

8. The method of claim 1, wherein the selective polarization patterns are formed by chemical or physical removal of pre-existing polarization creating material through the mask openings.

9. The method of claim 8, wherein the degree of polarization is controlled by the degree of removal of the polarization creating materials.

10. The method of claim 1, wherein the first relief mask is formed by graphic arts printing, inkjet printing, resist-forming, photomask lithography, imprint lithography, or semi-transparent imprint photomask lithography.

11. The method of claim 10, wherein a photosensitive polymeric material is used to form the first relief mask.

12. The method of claim 11, wherein the photosensitive polymeric material is a UV cross-linkable polymer.

13. The method of claim 11, wherein residual uncross-linked polymeric material is removed by treatment with a suitable solvent capable of solubilizing the residual uncross-linked polymeric material.

14. The method of claim 1 further comprising subsequently removing the mask after use.

15. The method of claim 1, further comprising removing excess polarization-creating material by rinsing.

16. A method for creating a laminated structure configured to display alternate images by switching polarization of a backlight source, and without the use of glasses by a viewer, the method comprising:
   providing a first polarizing material layer;
   forming, over the first polarizing material layer, a polymeric first relief mask having predetermined areas open to the underlying first polarizing material layer;
   forming selective polarization patterns corresponding to alternate images by selectively removing polarization creating material from or selectively adding polarization creating material to the areas in the first polarizing material layer exposed by the predetermined areas of the first relief mask, wherein a first patterned polarized image layer is produced;
   providing a second polarizing material layer;
   forming, over the second polarizing material layer, a polymeric second relief mask having predetermined areas open to the underlying second polarizing material layer;
   forming the selective polarization patterns corresponding to the alternate images by selectively adding polarization creating material to or selectively removing polarization creating material from the areas in the second polarizing material layer exposed by the predetermined areas of the second relief mask, wherein a second patterned polarized image layer is produced; and
   laminating the first and second patterned polarized image layers together, forming the laminated structure such that the polarization axes of the layers are perpendicular;

wherein the laminated structure is operative to display the alternate images in response to switching a polarization of the backlight source, and without the use of glasses by a viewer;

wherein the first polarizing material layer includes a stretched oriented polymer;

wherein the stretched oriented polymeric material includes a polarization creating material; and wherein the polarization creating material includes one or more of iodine or dichroic dyes.

17. A method for creating a laminated structure configured to display alternate images by switching polarization of a backlight source, and without the use of glasses by a viewer, the method comprising:

providing a first polarizing material layer;

forming, over the first polarizing material layer, a polymeric first relief mask having predetermined areas open to the underlying first polarizing material layer;

forming selective polarization patterns corresponding to alternate images by selectively removing polarization creating material from or selectively adding polarization creating material to the areas in the first polarizing material layer exposed by the predetermined areas of the first relief mask, wherein a first patterned polarized image layer is produced;

providing a second polarizing material layer;

forming, over the second polarizing material layer, a polymeric second relief mask having predetermined areas open to the underlying second polarizing material layer;

forming the selective polarization patterns corresponding to the alternate images by selectively adding polarization creating material to or selectively removing polarization creating material from the areas in the second polarizing material layer exposed by the predetermined areas of the second relief mask, wherein a second patterned polarized image layer is produced; and laminating the first and second patterned polarized image layers together, forming the laminated structure such that the polarization axes of the layers are perpendicular;

wherein the laminated structure is operative to display the alternate images in response to switching a polarization of the backlight source, and without the use of glasses by a viewer; and wherein the first polarization material layer includes a dye imbibition controlling polymeric overcoat.

18. A method for creating a laminated structure configured to display alternate images by switching polarization of a backlight source, and without the use of glasses by a viewer, the method comprising:

providing a first polarizing material layer;

forming, over the first polarizing material layer, a polymeric first relief mask having predetermined areas open to the underlying first polarizing material layer;

forming selective polarization patterns corresponding to alternate images by selectively removing polarization creating material from or selectively adding polarization creating material to the areas in the first polarizing material layer exposed by the predetermined areas of the first relief mask, wherein a first patterned polarized image layer is produced;

providing a second polarizing material layer;

forming, over the second polarizing material layer, a polymeric second relief mask having predetermined areas open to the underlying second polarizing material layer;

forming the selective polarization patterns corresponding to the alternate images by selectively adding polarization creating material to or selectively removing polarization creating material from the areas in the second polarizing material layer exposed by the predetermined areas of the second relief mask, wherein a second patterned polarized image layer is produced; and laminating the first and second patterned polarized image layers together, forming the laminated structure such that the polarization axes of the layers are perpendicular;

wherein the laminated structure is operative to display the alternate images in response to switching a polarization of the backlight source, and without the use of glasses by a viewer; and wherein the polymeric first relief mask contains pattern elements for equalizing transmitted light intensity of non-polarizing image areas with the transmitted light intensity of minimum density polarized image areas in order to prevent an appearance of ghost images.

* * * * *